United States Patent
Savell et al.

(10) Patent No.: US 8,060,226 B2
(45) Date of Patent: Nov. 15, 2011

(54) METHOD AND SIGNAL PROCESSING DEVICE TO PROVIDE ONE OR MORE FRACTIONAL DELAY LINES

(75) Inventors: Thomas C Savell, Santa Cruz, CA (US); Carl K Wakeland, Scotts Valley, CA (US)

(73) Assignee: Creative Technology Ltd, Singapore (SG)

( * ) Notice: Subject to any disclaimer, the term of this patent is extended or adjusted under 35 U.S.C. 154(b) by 1141 days.

(21) Appl. No.: 11/831,656

(22) Filed: Jul. 31, 2007

(65) Prior Publication Data

US 2008/0034024 A1    Feb. 7, 2008

Related U.S. Application Data

(60) Provisional application No. 60/821,107, filed on Aug. 1, 2006.

(51) Int. Cl.
    *G06F 17/00*    (2006.01)

(52) U.S. Cl. ................. 700/94; 381/61; 84/604

(58) Field of Classification Search ............ 700/94; 381/61; 84/604
See application file for complete search history.

(56) References Cited

U.S. PATENT DOCUMENTS

| 4,569,268 A | * | 2/1986 | Futamase et al. | 84/626 |
| 5,740,716 A | * | 4/1998 | Stilson | 84/661 |

* cited by examiner

*Primary Examiner* — Walter F Briney, III
(74) *Attorney, Agent, or Firm* — Schwegman, Lundberg & Woessner, P.A.

(57) ABSTRACT

Embodiments of a signal processing system, a method, and fractionally modulated digital delay lines are generally described herein. Other embodiments may be described and claimed. In some embodiments, a fractional address is generated by adding a delay value to a fractional offset value, and input sample values are interpolated based on a fractional portion of the fractional address. A write operation may be performed to the integer portion of the fractional address for each sample period using the interpolated input sample values. Adjusted addresses may be generated when addresses are either skipped of duplicated.

30 Claims, 29 Drawing Sheets

ON CHIP PRIMARY CACHE AND WRITE POINTER MODULATION

READ REQUEST

WRITE REQUEST

ON CHIP PRIMARY CACHE AND WRITE POINTER MODULATION

| DELAY | OFFSET | FRACTIONAL ADDRESS | INTEGER ADDRESS |
|---|---|---|---|
| 0 | 1.5 | 1.5 | 1 |
| 1 | 1.6 | 2.6 | 2 |
| 2 | 1.7 | 3.7 | 3 |
| 3 | 1.8 | 4.8 | 4 |
| 4 | 1.9 | 5.9 | 5 |
| 5 | 2.0 | 7.0 | 7 |
| 6 | 2.1 | 8.1 | 8 |
| 7 | 2.2 | 9.2 | 9 |
| 8 | 2.3 | 10.3 | 10 |
| 9 | 2.4 | 11.4 | 11 |
| 10 | 2.5 | 12.5 | 12 |

MISSING ADDRESS 6

*FIG. 32*

FRACTIONAL ADDRESS AND LINEAR INTERPOLATION

| DELAY | OFFSET | FRACTIONAL ADDRESS | INTEGER ADDRESS |
|---|---|---|---|
| 0 | 2.5 | 2.5 | 2 |
| 1 | 2.4 | 3.4 | 3 |
| 2 | 2.3 | 4.3 | 4 |
| 3 | 2.2 | 5.1 | 5 |
| 4 | 2.1 | 6.1 | 6 |
| 5 | 2 | 7 | 7 |
| 6 | 1.9 | 7.9 | 7 |
| 7 | 1.8 | 8.8 | 8 |
| 8 | 1.7 | 9.7 | 9 |
| 9 | 1.6 | 10.6 | 10 |
| 10 | 1.5 | 11.5 | 11 |

*FIG. 35*

FRACTIONAL ADDRESS AND LINEAR INTERPOLATION

| n | Xn | OFFSET | FR. ADD | OUT ADDR | WO | ADJ OUT ADDR | ADJ OUT DATA |
|---|---|---|---|---|---|---|---|
| 0 | 5 | 1.5 | 1.5 | 1 | 7.5 | 1 | |
| 1 | 10 | 1.6 | 2.6 | 2 | 12 | 2 | 7.5 |
| 2 | 15 | 1.7 | 3.7 | 3 | 16.5 | 3 | 12 |
| 3 | 20 | 1.8 | 4.8 | 4 | 21 | 4 | 16.5 |
| 4 | 25 | 1.9 | 5.9 | 5 | 25.5 | 5 | 21 |
| 5 | 30 | 2 | 7 | 7 | 35 | 6 | 25.5 |
| 6 | 35 | 2.1 | 8.1 | 8 | 39.5 | 7 | 30 |
| 7 | 40 | 2.2 | 9.2 | 9 | 44 | 8 | 35 |
| 8 | 45 | 2.3 | 10.3 | 10 | 48.5 | 9 | 39.5 |
| 9 | 50 | 2.4 | 11.4 | 11 | 53 | 10 | 44 |
| 10 | 55 | 2.5 | 12.5 | 12 | 27.5 | 11 | 48.5 |
| | | | | | | | 53 |

FRACTIONAL ADDRESS AND LINEAR INTERPOLATION

FRACTIONAL ADDRESS AND LINEAR INTERPOLATION

METHOD AND SIGNAL PROCESSING DEVICE TO PROVIDE ONE OR MORE FRACTIONAL DELAY LINES

CROSS REFERENCE TO RELATED APPLICATIONS

This patent application claims priority to U.S. Provisional Patent Application Ser. No. 60/821,107, filed Aug. 1, 2006 entitled "METHOD AND DEVICE TO PROVIDE FRACTIONAL DELAY LINES," the entire content of which is incorporated herein by reference.

TECHNICAL FIELD

Some embodiments pertain to digital delay lines. Some embodiments pertain to audio signal processing.

BACKGROUND

Delay lines are commonly used in the electronics art to provide predetermined amounts of delay for signals. The delay facilitates the implementation of many functions and features. For example, in the field of audio signal processing, digital audio delay lines are used to provide echo effects, reverberation effects, distortion effects, three-dimensional (3-D) audio, and environmental modeling.

A digital delay line is conventionally implemented with a block of memory that is accessed using two pointers, a read pointer and a write pointer. The memory block contains data samples. The read and write pointers point to locations in the delay line that contain the current read and write samples, respectively. As a data sample is written to the current location in the delay line, the write pointer is advanced to the next location. Similarly, as a data sample is retrieved from the delay line, the read pointer is advanced to the next data sample. The difference between the read and write pointers represents the signal delay, in sample periods. By adjusting the location of either the read or the write pointer, or both, different amounts of delay can be obtained.

Many digital signal processor (DSP) algorithms that use digital delay lines require access to the delay lines with minimal latency (or low or near-zero access delay). Typically, a relatively large number of delay lines are needed to support these algorithms. Further, a read and a write access are typically performed for each delay line and for each sample period.

BRIEF DESCRIPTION OF THE DRAWINGS

Example embodiments are illustrated by way of example, and not limitation, in the figures of the accompanying drawings, in which like references indicate similar elements unless otherwise indicated. In the drawings.

FIG. 32 shows a table of example values of modulated write pointer addresses;

FIG. 35 shows a table of example values of modulated write pointer addresses for an example set of decrementing offset values;

DETAILED DESCRIPTION

A method and device to provide digital delay lines that may be fractionally modulated are described. In the following description, example environments are initially described in which example embodiments of fractional delays may be deployed. Thereafter, more comprehensive details are provided of example embodiments that allow fractional modulation.

For purposes of explanation, numerous specific details are set forth in order to provide a thorough understanding of an example embodiment. It will be evident, however, to one skilled in the art that an example embodiment may be practiced without these specific details.

Figure 1:
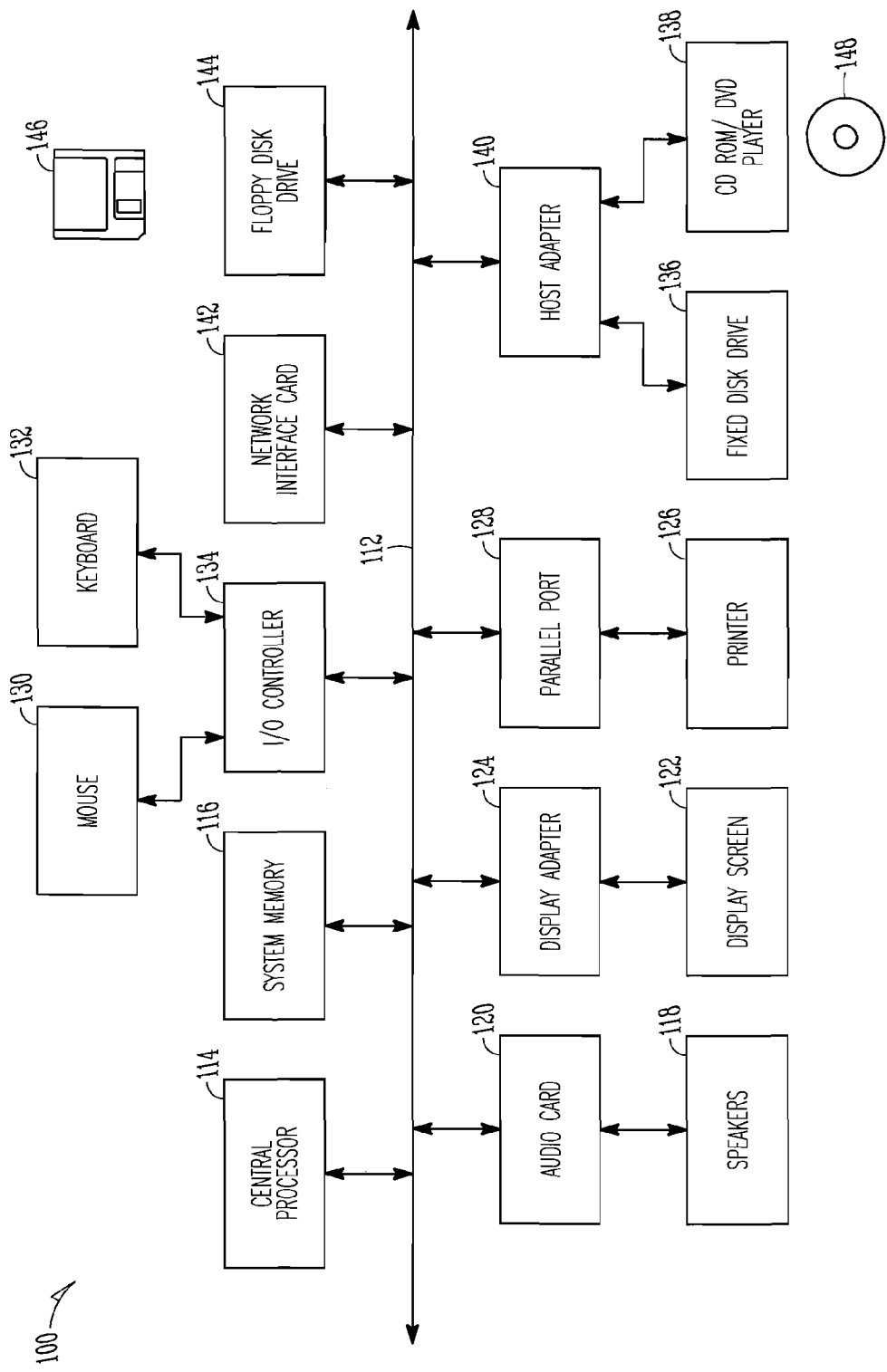
FIG. 1 shows the basic subsystems of a computer system suitable for implementing some example embodiments.

Referring to the drawings, FIG. 1 shows example subsystems of a computer system 100 suitable for implementing some example embodiments of an example embodiment. In FIG. 1, the computer system 100 includes a bus 112 that interconnects major subsystems such as a central processor 114, system or main memory 116, and optional external devices such as speakers 118 via an audio card 120, a display screen 122 via a display adapter 124, a printer 126 via a parallel port 128, a mouse 130 and a keyboard 132 via an input/output (I/O) controller 134, a fixed disk drive 136 and a CD-ROM/DVD player 138 via a host adapter 140, a network interface card 142, and a floppy disk drive 144 operative to receive a floppy disk 146.

It will be appreciated that many other devices or subsystems (not shown) can also be connected, such as a scanning device, a touch screen, and others. Also, it is not necessary for all of the devices or subsystems shown in FIG. 1 to be present to practice the present invention. Furthermore, the devices and subsystems may be interconnected in different configurations than that shown in FIG. 1. The operation of a computer system such as that shown in FIG. 1 is readily known in the art and is not discussed in detail herein. Source code, machine code, or machine-independent code to implement some example embodiments may be operatively disposed in the system memory 116, located in a subsystem that couples to the bus 112 (e.g., the audio card 120), or stored on storage media such as the fixed disk drive 136, the floppy disk 146, or a CD-ROM/DVD 148 that operates with the CD-ROM/DVD player 138.

The bus 112 can be implemented in various manners. For example, the bus 112 can be implemented as a local bus, a serial bus, a parallel port, or an expansion bus (e.g., ADB, SCSI, ISA, EISA, MCA, NuBus, PCI, or other bus architectures). The bus 112 may provide relatively high data transfer capability (e.g., through multiple parallel data lines) but may generally be characterized by a relatively high latency (long access time). Generally, for improved efficiency, in an example embodiment the bus 112 may operate in a "vectorized" or "burst" mode characterized by the grouping of many read or write transactions to memory addresses into a single memory "operation" performed on a "vector" of data. The system memory 116 can be a random-access memory (RAM), a dynamic RAM (DRAM), or other memory devices.

Figure 2:
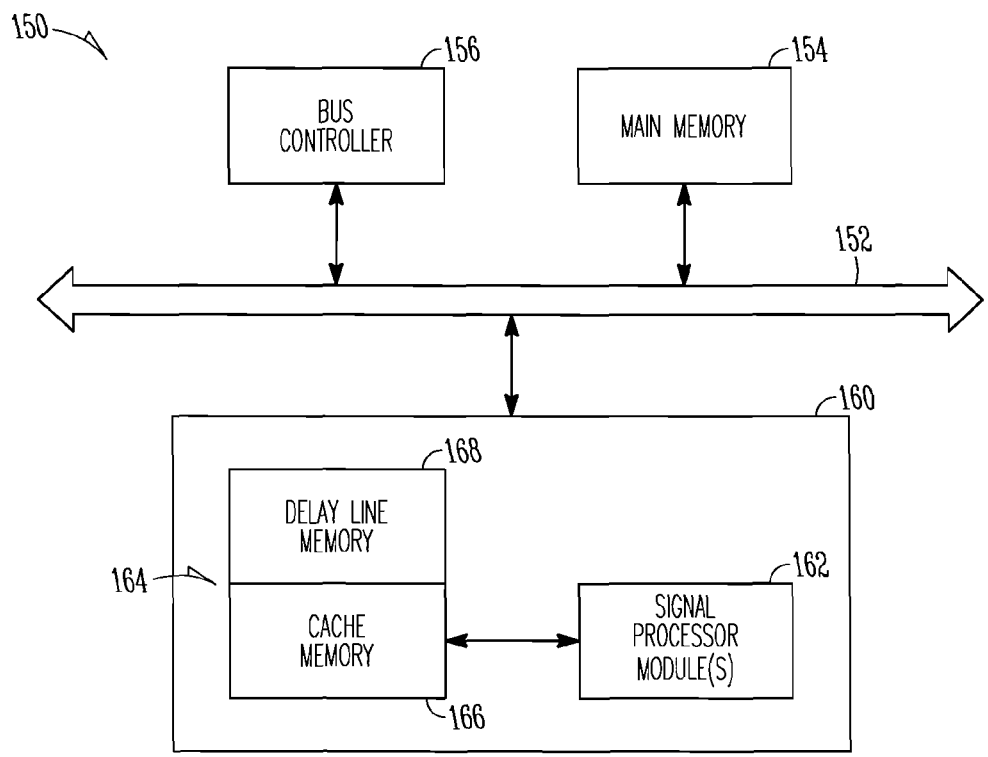
FIG. 2 shows a block diagram of an example embodiment of a signal processing system.

FIG. 2 shows a block diagram of an example embodiment of a signal processing system 150. The signal processing system 150 can be implemented within the computer system 100 shown in FIG. 1, where a bus 152 and a main or external memory 154 correspond to the bus 112 and the system memory 116, respectively. The signal processing system 150 can also be implemented within a circuit card or board (e.g., an audio card 120 in FIG. 1), where the bus 152, the main memory 154, and a bus controller 156 are elements of the circuit card. The signal processing system 150 can further be implemented, at least in part, within an integrated circuit, such as a microprocessor, a digital signal processor (DSP), a microcomputer, an application specific integrated circuit (ASIC), or the like.

Within the signal processing system 150, the bus 152 interconnects the main memory 154, the bus controller 156, and a signal processing subsystem 160. In an example embodiment, the signal processing subsystem 160 is implemented within an integrated circuit including a bus interface (e.g., a PCI interface) to interface the signal processing subsystem 160 to the bus 152. The signal processing subsystem 160 may include one or more signal processor module(s) 162 coupled to subsystem or circuit memory 164. In an example embodiment, the circuit memory 164 is local on-chip internal memory forming an integral part of the signal processing subsystem 160 as opposed to the main or external memory 154 which may form part of a host computer system (e.g., the computer system 100). In an example embodiment, the circuit or subsystem memory 164 defines a cache memory portion 166 and a delay line memory portion 168. However, it will be appreciated that the subsystem memory 164 need not include delay line memory but may include only cache memory. Likewise, the subsystem memory 164 need not include cache memory but may include only delay line memory.

In an example embodiment, the signal processing system 150 is an audio processing system for processing digital audio signals. In this example embodiment, a plurality of signal processor modules 162 may be provided. Examples of signal processor modules 162 include, a signal mixer, a sample rate converter, filters, and supporting circuitry for a CD input, a line input, a MIC input, and a speaker output. An example embodiment of such a system including a plurality of signal processing modules or circuits is described below with reference to FIG. 6.

The cache memory portion 166 provides a buffer between the main memory 154 and the signal processor module 162. The main memory 154 may store the data samples to be operated on or processed by the signal processor module 162. However, since the bus 152 in an embodiment may typically operate in a burst mode and have a high latency, the data samples may be transferred, one block at a time, between the main memory 154 and the cache memory portion 166. The data samples in the cache memory portion 166 may then be more conveniently accessed by the signal processor module 162. The cache memory portion 166 may be implemented, by a person skilled in the art, with sufficient size to provide the required functionality. As described in more detail below, the cache memory portion 166 may include a primary delay line cache and a secondary delay line cache. It will be appreciated that the cache memory 166 may be defined by one or more memory circuits on one or more integrated circuits or chips.

Audio systems for processing digital signals are well known in the art. An example of caching at a circuit level is described in U.S. Pat. No. 5,342,990 entitled "DIGITAL SAMPLING INSTRUMENT EMPLOYING CACHE MEMORY," assigned to the assignee of the present invention, and incorporated herein by reference.

Figure 3:
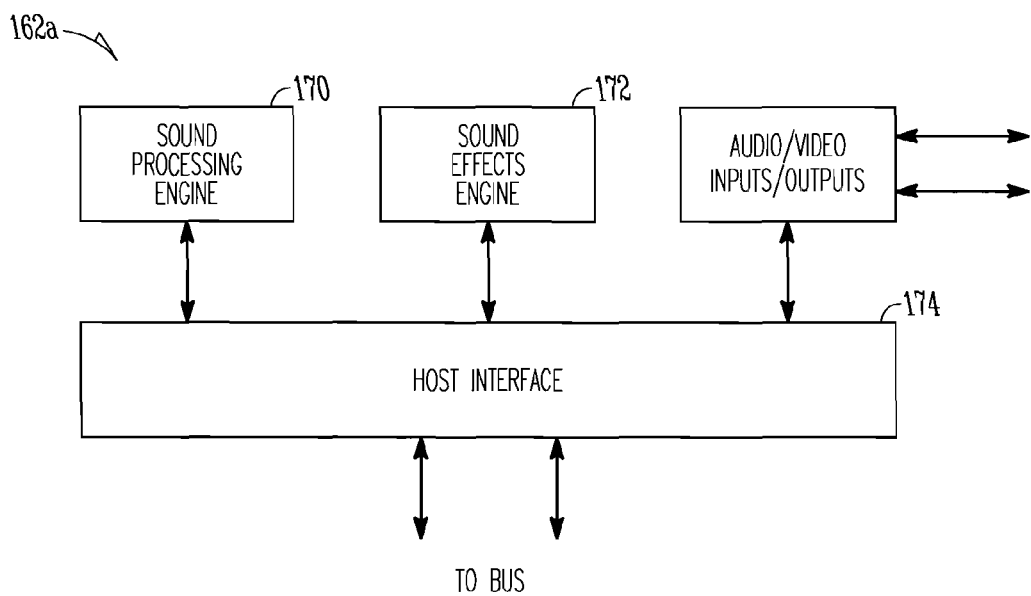
FIG. 3 shows a simplified block diagram of a signal processor used for audio signal processing.

FIG. 3 shows a simplified block diagram of an example signal processor module 162a used for audio processing. The signal processor module 162a may, for example, implement the signal processor module 162 in FIG. 2. The signal processor module 162a may include three primary functional units: a sound processing engine 170, a sound effects engine 172, and a host interface unit 174. The sound processing engine 170 can include, for example, a 64-voice wavetable synthesizer and 16 summing effects buses. Each of the 64 voice channels can be routed, at its respective programmable amplitude, to an arbitrary selection of four of these buses.

The sound effects engine 172 may receive input from the sound processing engine 170 and from additional audio inputs (not shown) such as CD Audio, $I^2S$, a microphone jack, a stereo input and an auxiliary S/PDIF input, among others. The sound effects engine 172 may include functional units to execute signal processing instructions from a digital signal processor (DSP) program. The host interface unit 174 may interface the sound effects engine 172 with a host processor (e.g., the central processor 114 in FIG. 1) using, for example, a PCI protocol. Although not shown in FIG. 3, the signal processor module 162a can also include a memory element or circuitry for storing, for example, source code that directs the operation of the functional units within the signal processor module 162a. A configuration wherein various signal processing modules of the example processor module 162 are arranged in a ring configuration is described in U.S. patent application Ser. No. 10/636,087 filed Aug. 6, 2003, assigned to the assignee of the present invention, and incorporated herein by reference. Details of another configuration of example functional units of the signal processor module 162 are also set forth in U.S. Pat. No. 5,928,342, entitled "AUDIO EFFECTS PROCESSOR INTEGRATED ON A SINGLE CHIP WITH A MULTIPORT MEMORY ONTO WHICH MULTIPLE ASYNCHRONOUS DIGITAL SOUND SAMPLES CAN BE CONCURRENTLY LOADED," assigned to the assignee of the present invention, and incorporated herein by reference.

Figure 4:
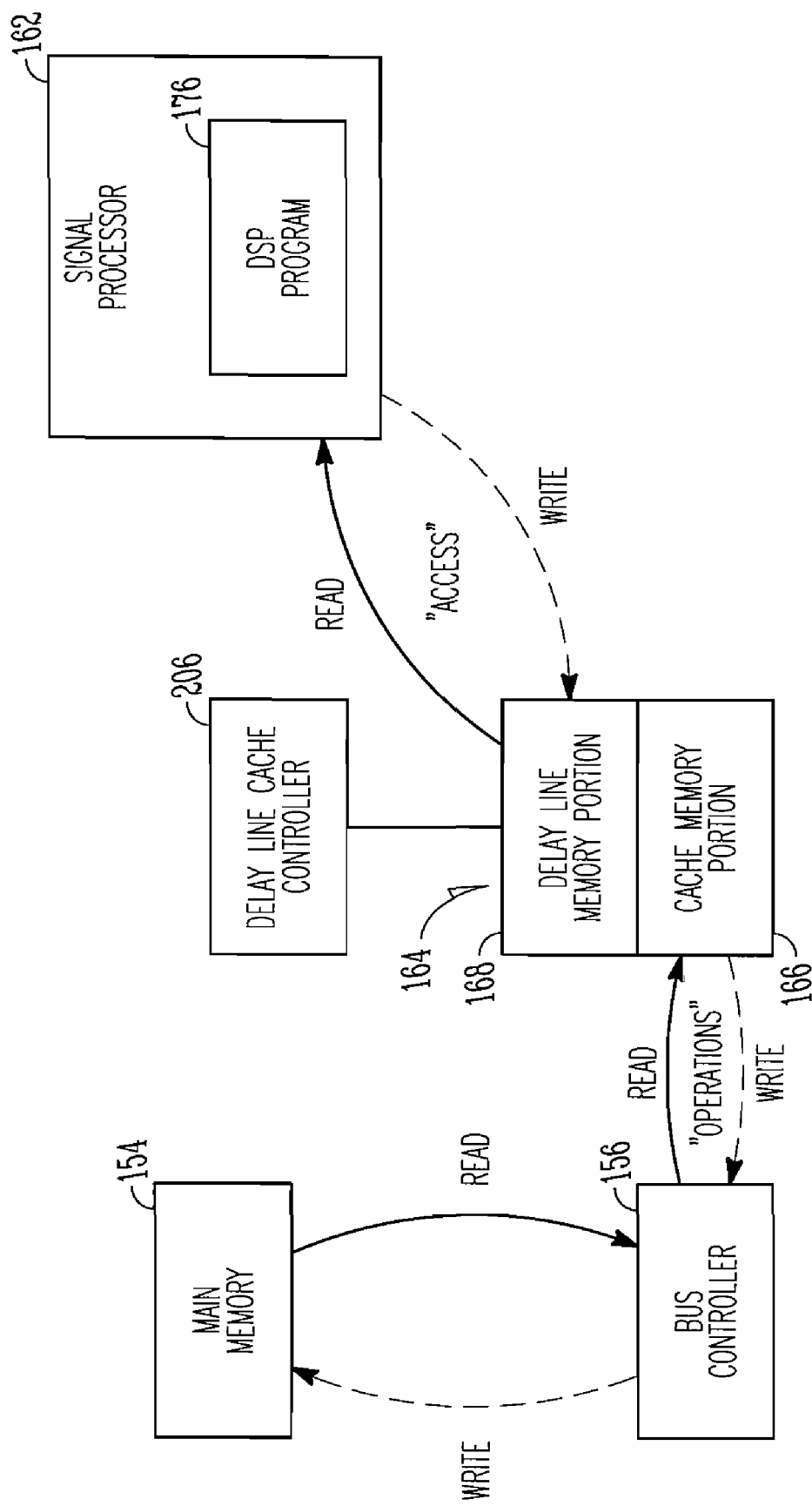
FIG. 4 shows the interaction, in accordance with an example embodiment, between a signal processor, main memory, and cache memory.

FIG. 4 shows example interaction, between the signal processor module 162, the main or external memory 154, and the circuit memory 164. The signal processor module 162 may execute a DSP program 176 that implements algorithms that produce the desired effects. For example, for audio processing, the DSP program 176 may generate echo effects, reverberation effects, distortion effects, 3-D audio, environmental modeling, and others. The DSP program 176 may operate on data samples that reside within the main memory 154. The DSP program 176 may also provide data samples to be stored to the main memory 154. However, in certain embodiments, because of the high latency and burst characteristics of the data transfer to and from the main memory 154, the data samples are temporarily stored in the intermediate cache memory portion 166. For a read access of a data sample by the DSP program 176, the data sample may be retrieved from the cache memory portion 166. Periodically, the contents of the cache memory portion 166 may be replenished by performing a read operation from the main memory 154. Similarly, for a write access of a data sample by the DSP program 176, the data sample may be stored to the cache memory portion 166, and the contents of the cache memory portion 166 may be periodically transferred to the main memory 154 by performing a write operation. For clarity, as used herein, read and write "accesses" include the data transfer between the signal processor module 162 and the circuit memory 164 (including, for example, the cache memory portion 166 and the delay line memory portion 168), and read and write "operations" include the data transfer between the cache memory portion 166 and the main memory 154.

The cache memory portion 166 may thus provide an interface between the main memory 154 and the signal processor module 162. The cache memory portion 166 may bridge the gap between the high-latency, block data transfer characteristics (e.g., of a typical computer system) and the low-latency, single data sample access requirements of the DSP program 176. Further, in an example embodiment when implementing digital delay lines, delays in updating the cache memory portion 166 that may render it unsuitable for use by the processor module 162 may be avoided by reading and writing directly to the delay line memory portion 168.

In an embodiment, to efficiently utilize the bus 152 (e.g., with its relatively high latency), the read and write operations may be "vectorized" such that a block of B data samples are read from, or written to the main memory 154 in a single transaction. Data samples required by the signal processor module 162 may be "pre-fetched," a block at a time, from the main memory 154 and temporarily stored in the cache memory portion 166. Similarly, in an embodiment, data samples generated by the signal processor module 162 may be stored to the cache memory portion 166 and subsequently "post-written," a block at a time, to the main memory 154. The cache memory portion 166 may thus provide relatively low-latency access to data samples, on-demand as they are needed by the DSP program 176, and on individual samples.

In some embodiments, the "pre-fetch" may be possible because the data "usage" is deterministic, and it is possible to know a priori which data samples will be needed in the future. In some other embodiments, the data samples needed in the future can be predicted or estimated. Thus, the data accesses by the processor may be effectively "anticipated." An example method and circuit for implementing some embodiments of the present invention is described in U.S. Pat. No. 6,275,899, entitled "METHOD AND CIRCUIT FOR IMPLEMENTING DIGITAL DELAY LINES USING DELAY CACHES," filed Nov. 13, 1998, and assigned to the assignee of the present invention, and is incorporated herein by reference. The implementation of delay lines as circular buffers is described in U.S. patent Ser. No. 08/887,362. A method and circuit that initialize a memory, such as delay lines within main memory 154, and indicate when valid data is available from the memory are described in U.S. Pat. No. 6,032,235, entitled "MEMORY INITIALIZATION CIRCUIT," filed Nov. 14, 1998, and assigned to the assignee of the present invention, and is incorporated herein by reference.

Figure 5:
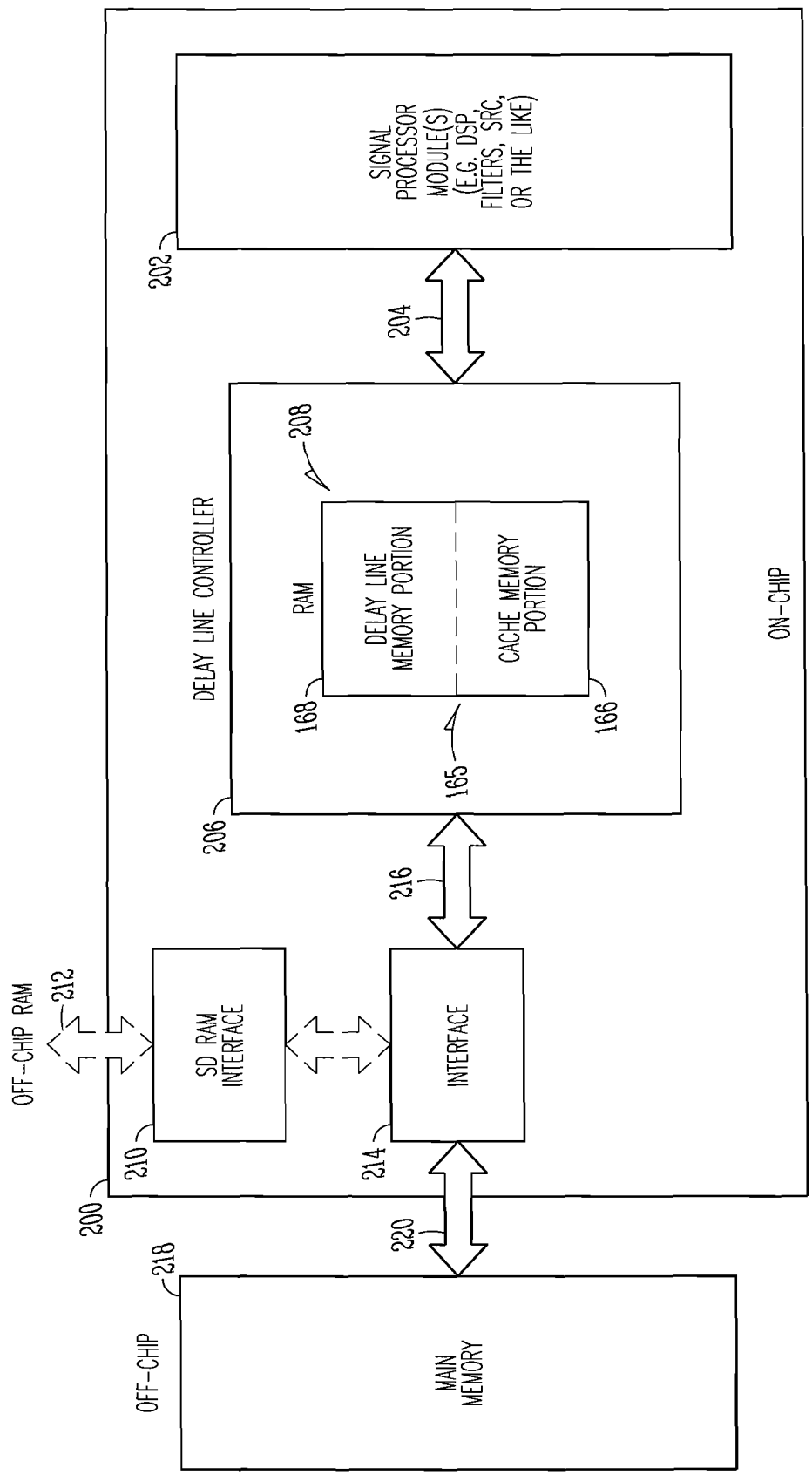
FIG. 5 shows a schematic block diagram of a circuit, in accordance with an example embodiment, for implementing digital delay lines within external or main memory and on-chip memory.

Referring to FIG. 5 of the drawings, reference numeral 200 generally indicates a further embodiment of a digital signal processing subsystem, in accordance with an example embodiment. The subsystem 200 may resemble the signal processing subsystem 160 and, in an example embodiment, may form part of (or be fully implemented by) an integrated circuit or chip. The subsystem 200 includes at least one digital signal processor module 202 connected via a bus 204 to a delay line cache controller 206. As described in more detail below, the signal processor module 202 may communicate data samples to the delay line cache controller 206 which, using external and/or internal delay lines, delays the digital samples. In an example embodiment, the delay line cache controller 206 includes on-chip or local memory such as circuit memory 208 that has a delay line memory portion 168 and a cache memory portion 166. The circuit memory 208 may be, for example, a 64 kilobyte RAM circuit provided on a silicon wafer on which the subsystem 200 is defined. It will, however, be appreciated that the circuit memory 208 need not necessarily form part of the delay line controller 206 but may be formed anywhere locally on the subsystem 200.

In an example embodiment, the sizes (e.g., the relative sizes) of the delay line memory portion 168 and the cache memory portion 166 may be adjusted as generally indicated by a boundary pointer 165. Thus, in use, an amount of memory that the delay line memory portion 168 uses of the available memory provided by the circuit memory 208 may vary and, accordingly, an amount of memory of the circuit memory 208 used by the cache memory portion 166 may also vary. In an example embodiment, all memory of the circuit memory 208 is allocated between the delay line memory portion 168 and the cache memory portion 166.

In certain embodiments, the subsystem 200 may optionally include an SDRAM interface 210 for interfacing off-chip SDRAM to the subsystem 200 via a bus 212. It will, however, be appreciated that the circuit memory 208 (or any off-chip memory) need not be limited to RAM or random access memory but may be any type of memory for storing digital data.

The subsystem 200 also includes an interface 214 connected to the delay line cache controller 206 via a bus 216. The interface 214 is also connectable to external or main memory 218 that is off-chip, or to the off-chip RAM via the bus 212. The main memory 218 may correspond to the main memory 154 (see FIG. 2) and, accordingly, a communication bus 220 that connects the main memory 218 and the interface 214 may correspond to the bus 152 (see FIG. 2). In a similar fashion, the circuit memory 208 may correspond to the circuit memory 164 of FIG. 2.

In the example configuration of the subsystem 200 shown in FIG. 5, the signal processor module 202 may represent any one or more signal processing modules for processing digital signals, e.g., digital audio signals. For example, the digital signal processor module 202 may include a sample rate converter module, a filter module, a digital signal processor (DSP) module, or any other module required to process digital audio signals. It is, however, to be appreciated that an example embodiment applies equally to the digital processing of other digital signals such as video signals. In these circumstances, the digital signal processor module 202 may then represent any one or more video signal processing modules or circuits. In an example embodiment, the filter module, sample rate converter module, and the like may be connected to a DSP which then communicates or implements any delays required by any one or more of the modules including delays of digital signals required by the DSP. As described above, the host system (e.g., the computer system 100) to which the subsystem 200 is connectable may include a DSP program (e.g., the DSP program 176) for executing various algorithms to process the digital signals (e.g., audio and/or video signals and/or any other digital signals).

Figure 6:
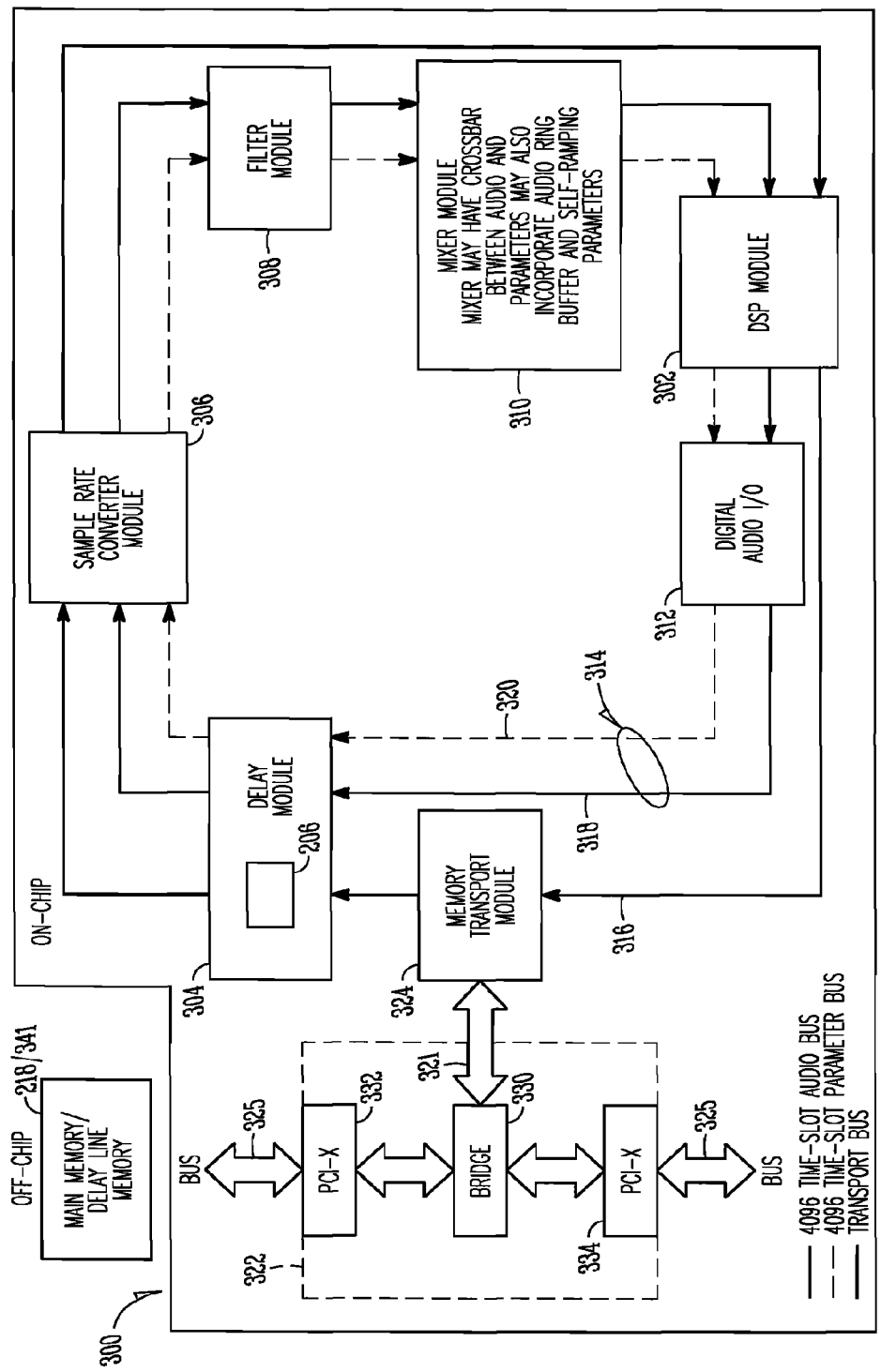
FIG. 6 shows a schematic block diagram of a circuit, in accordance with an example embodiment, for implementing digital delay lines used by various signal processing modules arranged in a ring configuration.

Referring to FIG. 6, reference numeral 300 generally indicates a further example embodiment of a digital signal processing subsystem, in accordance with an example embodiment. The subsystem 300 may be in the form of a digital processing circuit including a plurality of digital signal processing modules arranged in a ring or circular fashion. For example, the subsystem 300 may include a DSP module 302, a delay module 304 including a delay line controller (e.g., a delay line cache controller 206), a sample rate converter module 306, a filter module 308 and a mixer module 310. Further, the subsystem 300 may include a digital audio input/output (I/O) module 312. The various modules 302 to 312 are interconnected by a data bus 314 and a transport bus 316. The data bus 314 may include an audio bus 318 and a parameter bus 320. It is, however, to be appreciated that an example embodiment is not limited to a configuration of modules that are arranged in a ring but applies in any situation where one or more signal processor modules communicate directly or indirectly with circuitry or components implementing delay lines (e.g., as shown in FIG. 5).

In an example embodiment, the subsystem 300 also includes a transport control or bus interface 322 connected via a transport bus 321 to a memory transport module 324. The memory transport module 324 is connected via the transport bus 316 to the delay module 304, the sample rate converter module 306, and the DSP module 302. Accordingly, any one of the example modules 302, 304, and 306 may communicate data to a host system (see for example the computer system 100 of FIG. 1) via the transport control interface 322. The transport control interface 322 may be integrally formed on-chip with the other modules of the subsystem 300.

As described in more detail below, any one of the modules 306, 308, 310, 302, and 312 can communicate digital data samples, which are to be delayed, to the delay module 304. Typically, the modules 306, 308, 310, 302, and 312 communicate digital data samples representative of, for example, audio data that is to be delayed using the delay module 304. As described above and in more detail below, the delay module 304 may then implement delay lines directly within its circuit memory 164 (e.g., its delay line memory portion 168 when included in a particular embodiment) and/or in the main memory 218 via the cache memory portion 166.

Figure 7:
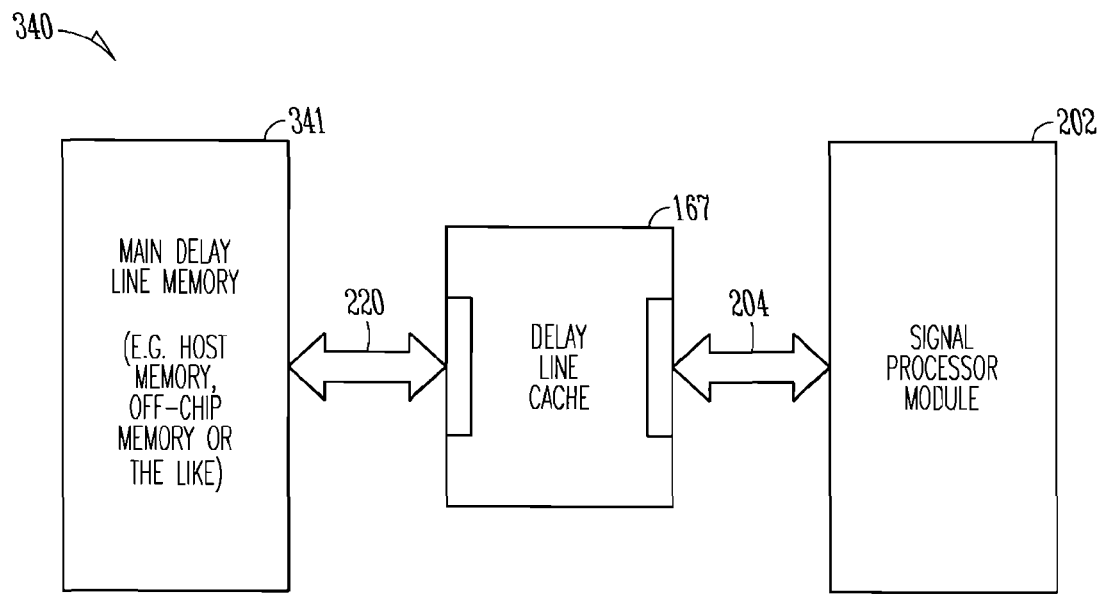
FIG. 7 shows a schematic block diagram of a digital processing subsystem, in accordance with an example embodiment, including external digital delay lines provided in main delay line memory and interfaced to a signal processor module via delay line cache.

Referring in particular to FIG. 7, reference numeral 340 generally indicates an example digital processing subsystem, in accordance with an example embodiment, to implement external digital delay lines in main delay line memory 341 interfaced to a signal processor module via delay line cache. The digital processing subsystem 340 includes an example signal processor module 202 that communicates with an example delay line cache 167 via a communication bus 204. The delay line cache 167 communicates via a communication bus 220 (e.g. a PCI bus) with the main delay line memory 341.

It will be appreciated by one skilled in the art that data samples may be stored in any memory and not merely in the host memory 218 and/or the off-chip RAM and the terms may be used interchangeably. Thus, for the purposes of this specification, the term "main delay line memory" is intended to include the host memory 218 and/or the off-chip RAM or memory. Thus, any reference to the "main delay line memory" in this specification may apply equally to any off-chip memory. In an example embodiment, from a system point of view, different main delay line memory 341 (e.g., the host memory 218 and/or the off-chip RAM or memory) may be indistinguishable. The off-chip memory may be provided in a different chip but on the same card or circuit board. As discussed above with reference to FIG. 5, the signal processor module 202 and the delay line cache 167 may be integrated on a single chip defining a signal processing subsystem (e.g. a signal processing subsystem 200 or 300) that processes digital signals (e.g. audio and/or video data). In an example embodiment, the delay line cache 167 communicates data samples, received from the main delay line memory 341), to the signal processor module 202 under control of a delay line controller, for example, the delay line cache controller 206 (see FIGS. 4 to 6). As described in more detail below, the delay line cache controller 206 may provide the example signal processor module 202 with data samples upon request or based on an identifier (e.g. an address identifier) received from the signal processor module 202. As discussed above, the signal processor module 202 may, for example, be defined by a filter module, a sample rate converter module, a DSP module, a mixer module, or any circuitry processing digital data that requires a delay in data samples. Further, in an example embodiment, a plurality of signal processing modules (e.g., the modules 306, 308, 310, 302, 312 shown in FIG. 6) is arranged in a ring configuration.

Example Primary/Secondary Delay Line Cache Arrangement

Figure 8:
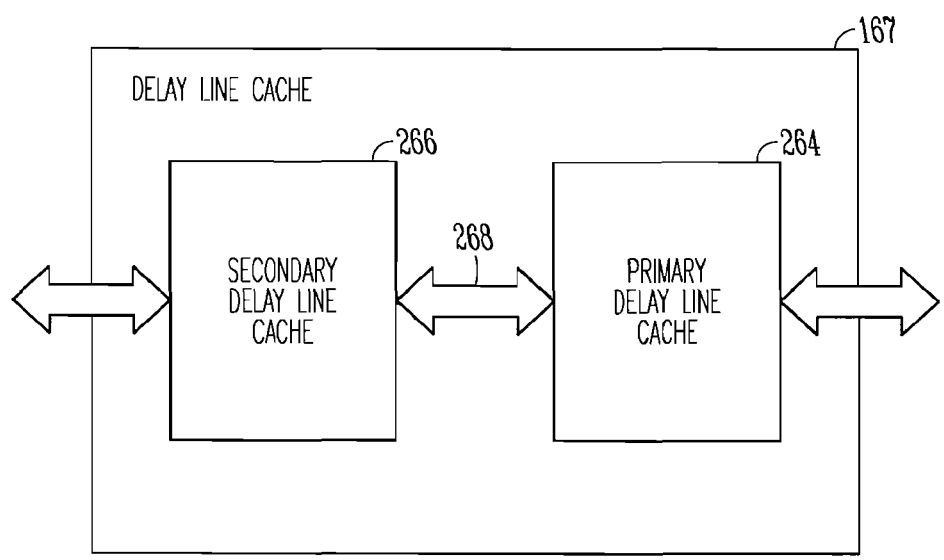
FIG. 8 shows a schematic block diagram of a delay line cache in accordance with an example embodiment.

In an example embodiment as shown in more detail in FIG. 8, the delay line cache 167 may include a primary delay line cache 264 and a secondary delay line cache 266 connected via a communication link 268. In an example embodiment, the primary delay line cache 264 and the secondary delay line cache 266 are provided on a single integrated circuit or chip and, accordingly, the communication link 268 may be an on-chip bus which links the secondary delay line cache 266 and the primary delay line cache 264.

Example Primary Delay Line Cache

In an example embodiment, the primary delay line cache 264 includes a plurality of delay caches each of which, for example, are dedicated to a channel provided on the audio bus 318 of the digital processing subsystem 300. As mentioned above, the delay line cache 167 may be used in the digital signal processing subsystem 200 wherein the signal processor module or modules 202 communicate directly with the main memory 218, or in the digital signal processing subsystem 300 where a plurality of digital signal processing modules are arranged in a ring configuration. Although the application of the delay line cache 167 may apply equally in either configuration, its application in the digital signal processing subsystem 300 is described below by way of example.

When the delay line cache 167 forms part of the delay module 304 (see FIG. 6) of the signal processing subsystem 300, the primary delay line cache 264 may communicate with any one or more of the modules 302, 306, 308, and 310 via the audio bus 318 and the parameter bus 320.

Figure 9:
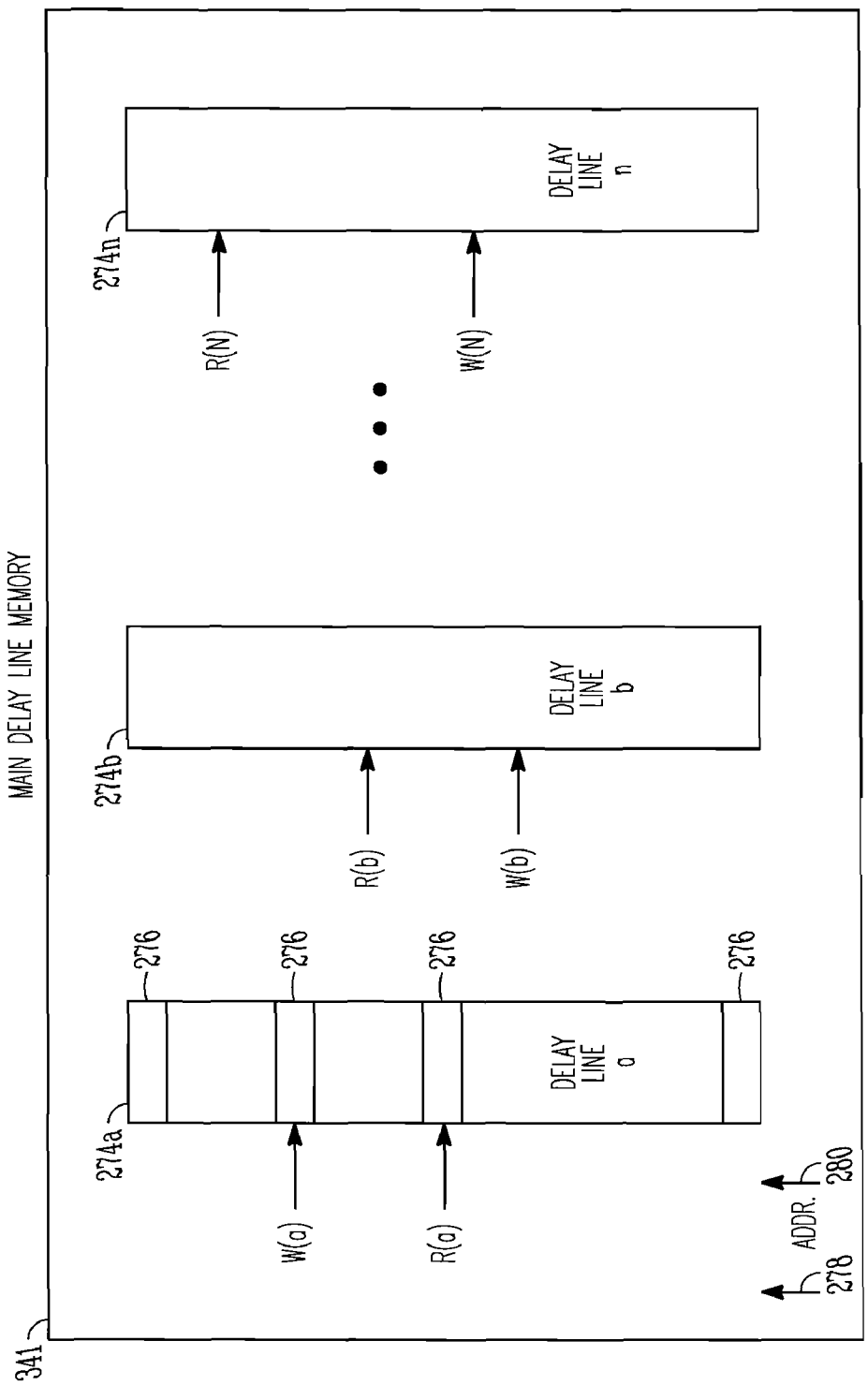
FIG. 9 shows a schematic representation of the implementation of multiple external delay lines within a main delay line memory.
Figure 10:
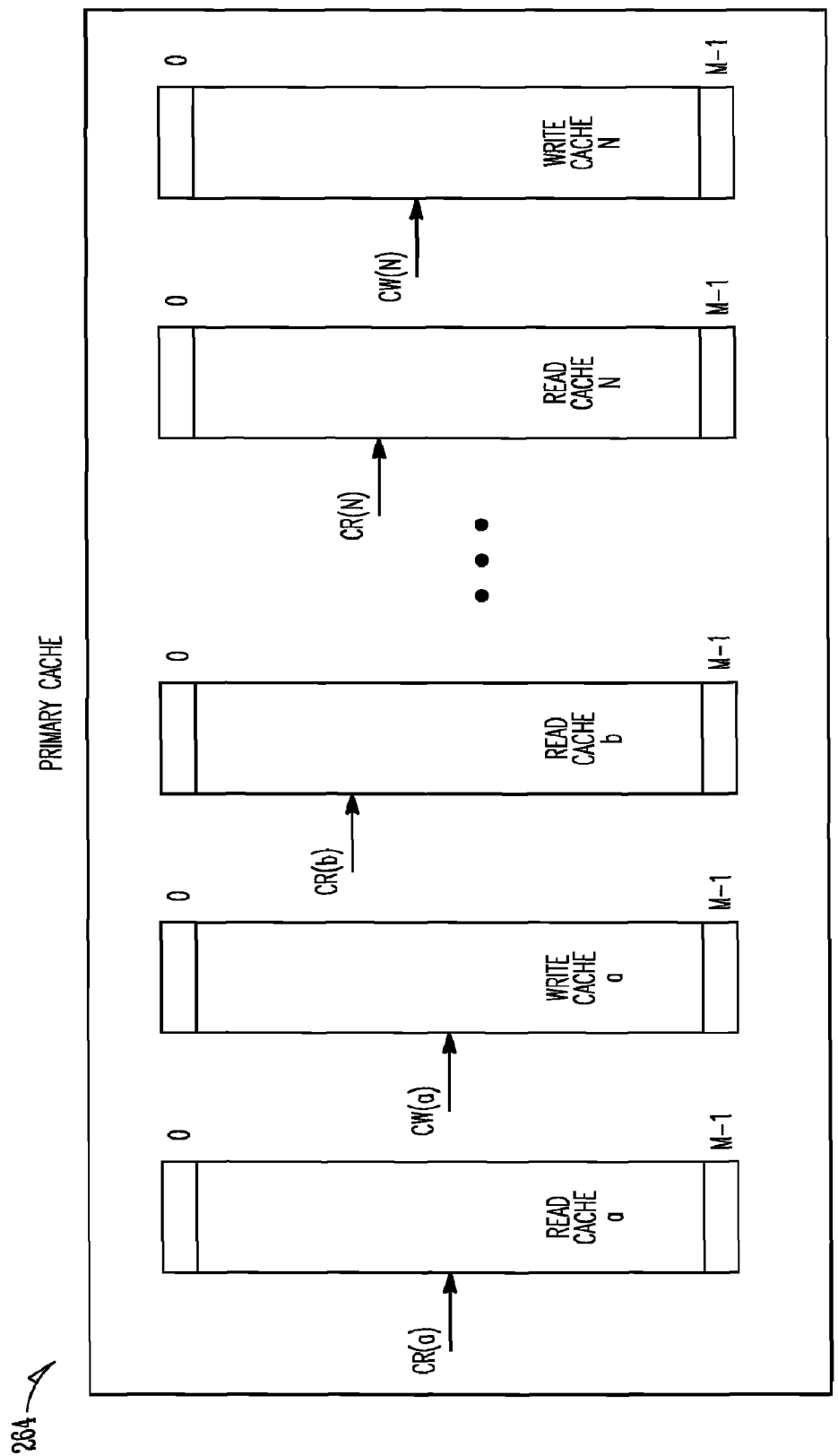
FIG. 10 shows a schematic representation of example multiple primary cache lines implemented in cache memory.
Figure 11:
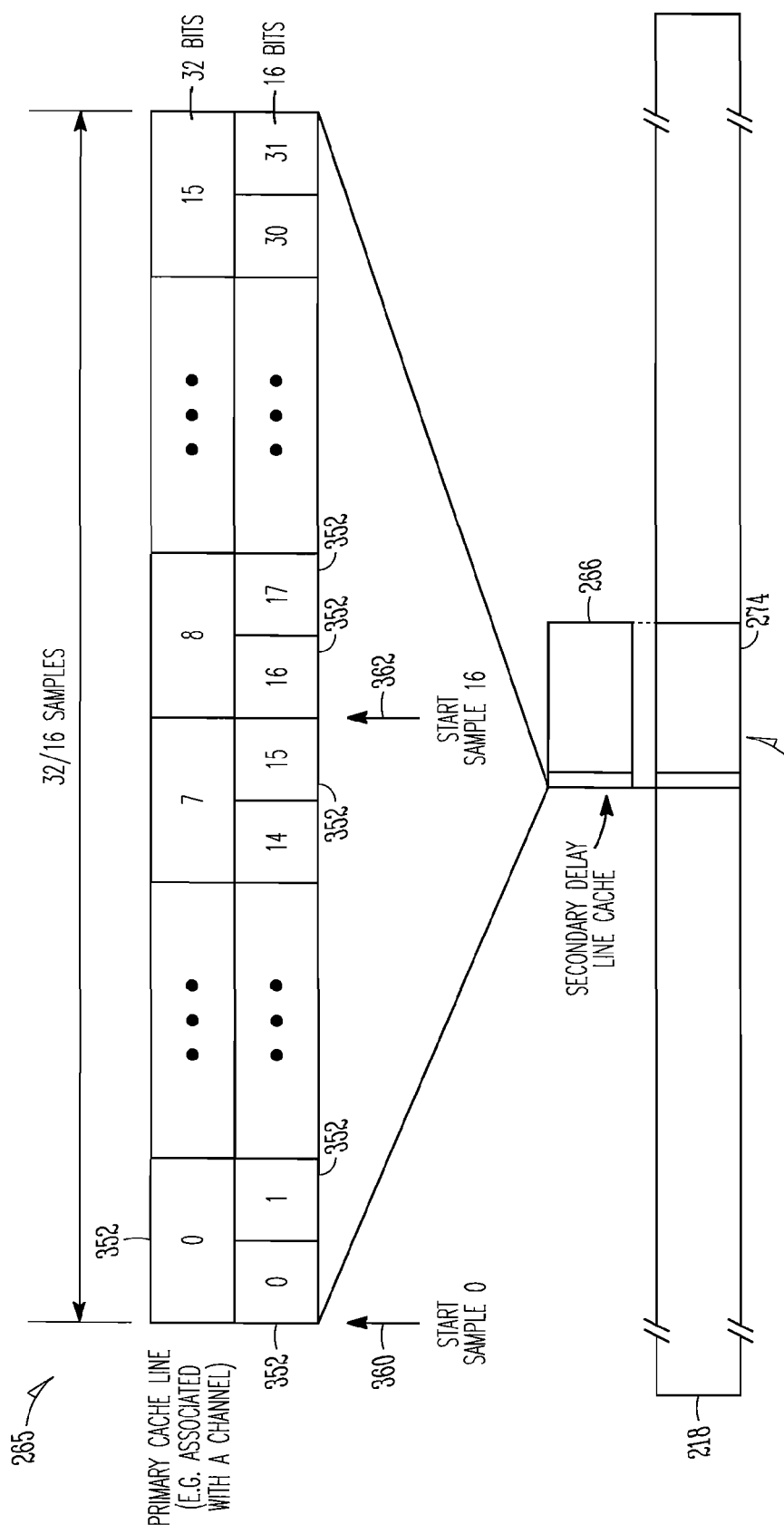
FIG. 11 shows a schematic representation of example primary and secondary delay line caches, in accordance with an example embodiment.

FIG. 9 shows an example layout of a plurality of delay lines in the main delay line memory 341. In the example embodiment, delay lines 274a to 274n are shown to include memory locations 276. It will be appreciated that the number of memory locations in each delay line 274 is dependent upon the length of the delay to be implemented in the delay line 274. As shown by time arrow 278 and address arrow 280, time and physical address locations increment in the same direction in the example delay lines 274. In particular, each delay line 274 begins with a write (W(a)-W(n)) operation to a higher address and ends with a read (R(a)-R(n)) operation from a lower address. As time and physical addresses increment together, a read (R(a)-R(n)) operation will eventually occur at the address of a write (W(a)-W(n)) operation that occurred in the past. In this way, the result of the read operation has a time delay relative to the write operation. Thus, in an example embodiment, digital data (e.g. audio data, video data, or any other digital data to be delayed) is written to the main delay line memory 341 in an ascending address order and so the start of a delay line 274 is at a lower address and, accordingly, the end of the delay line 274 is at a higher address. As mentioned above, the primary delay line cache 264 may be cache dedicated per channel. In an example embodiment, each channel of the data bus 314 has its own dedicated primary cache line 265 (e.g. a 64-byte cache that may accommodate 32 16-bit samples or 16 32-bit samples—see FIG. 11).

In the example implementation of the delay line cache 167 in the digital processing subsystem 300, any one of the modules 302, 306, 308, and 310 may provide data samples on the audio bus 318 (and parameters on the parameter bus 320 to control processing of the data samples) for communication to the delay module 304. When the data samples are provided in channels, the audio bus 318 may provide channel in service data (e.g. identifying a channel when the data bus 314 is time-multiplexed) that identifies memory locations for servicing in the primary delay line cache 264. As described in more detail below, the least significant bits (LSB) of a primary delay line cache address may be sourced from the delay memory logical address, and the most significant bits (MSB) may come from a channel in service indicator.

Figure 12:
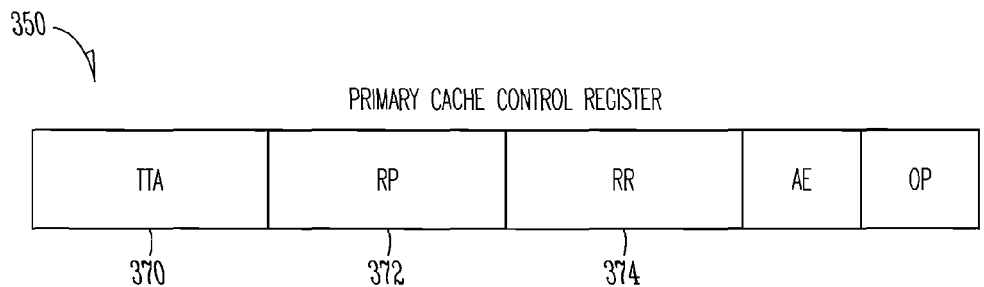
FIG. 12 shows an example primary cache control register to control operation of the primary delay line cache.

Referring in particular to FIG. 12, reference numeral 350 generally indicates an example primary cache control register to control read and write accesses to the primary delay line cache 264. As mentioned above, in an example embodiment each primary cache line 265 may be a 64-byte cache that can accommodate data samples 352 (only a few of which are referenced in FIG. 11), for example, thirty-two 16-bit samples or sixteen 32-bit samples. It will be noted from FIG. 11 how, in an example embodiment, the 32-bit samples may align in the cache relative to 16-bit samples. Each primary cache line 265 may correspond to a delay line 274 in the main delay line memory 341. However, the example primary cache line 265 does not represent an entire delay line 274 in the main delay line memory 341. It represents a subset of data from the main delay line memory 341. A primary cache line 265 may thus mirror data samples in a portion of the main delay line memory 341. Thus, each primary cache line 265 may resemble a sliding window 364 into a single delay line provided in the external or main delay line memory 341. In order to identify the position of the window 364, and thus identify specific memory locations in the main delay line memory 341 providing a delay line, an external or main memory address 369 may be used (see FIG. 13). In an example embodiment, the external or main memory address 369 may optionally be a logical address that can be translated to a physical address using a page table or other translation means.

In particular, in an example embodiment, the least significant 4 or 5-bits 368 of a delay memory logical address 366 may be equal to the cache read/write address of a corresponding primary cache line (see FIG. 13) in the primary delay line cache 264, the number of bits depending on whether the delay line contains sixteen 32-bit samples or thirty-two 16-bit samples. As described in more detail below, when it is detected that less than a minimum number of samples remain unread in the primary delay line cache 264, the primary delay line cache 264 (and thus the primary cache line 265) may be replenished with data, via the secondary delay line cache 266, from the main delay line memory 341. In the example primary cache line 265 including, for example thirty-two 16-bit samples 352, when it is detected that 16 (or fewer) samples remain unread (e.g. by circuitry in the delay module 304) the delay line cache logic (e.g. via the delay line cache controller 206) may generate a request to the secondary delay line cache 266 for 16 (or fewer) samples (e.g. eight DWORDS).

In order to service the primary delay line cache 264 with samples to replenish those that have already been read, in an example embodiment, the secondary delay line cache 266 may issue a request for data samples from the main delay line memory 341. For example, in the present example, a request for 16 samples or eight DWORDS may be issued and, accordingly, two possible start addresses within each primary cache line 265 may be used, for example, 0 and 16 as generally indicated by arrows 360 and 362 respectively, (see FIG. 11). Accordingly, when samples 0 to 15 have been read, then the delay line controller logic may require a burst of fresh samples from the main delay line memory 341 to replace the samples 0 to 15 that have just been read by the primary delay line cache 264.

It will be appreciated that, once sample number 16 has been read, samples 0 to 15 can be discarded since addresses must proceed in a monotonically increasing manner. Accordingly, when the delay module 304 communicates (e.g. via the audio bus 318) sample 16 to the signal processor modules 302, 306, 308, 310, 312, bit 4 (16=binary 10000) of the delay memory logical address (which corresponds to the addressing of the primary delay line cache 264) may act as a trigger (e.g., a trigger signal) to retrieve data from the secondary delay line cache 266 to replace data in samples 0 to 15 of the primary delay line cache 264. Likewise, once sample 0 has been communicated to the audio bus 318 by the delay module 304, the delay line controller logic may then discard samples 16 to 31 and, accordingly, bit 4 of the memory logical address would then be equal to 0 which, in turn, may then trigger replacement of the data in samples 16 to 31 with data sourced from the secondary delay line cache 266. Thus, in an example embodiment, one or more bits in the address of a primary cache line 265 in the primary delay line cache 264 may trigger the updating of sample data that has already been processed or read (e.g., passed onto the audio bus 318 by the delay module 304).

In an example embodiment, the primary cache control register 350 may store a 1-bit field that identifies a trigger address (TTA) bit 370 (see FIG. 12). In the signal processing subsystem 300, the trigger address may be regarded as a transport trigger address as sample data is communicated to and from the main delay line memory 341 via the transport bus 316. It will be appreciated that the TTA field needs not be limited to one bit, but may be any number of bits. The choice of number of bits may depend on the transport latency, size of primary cache, overall bandwidth requirements, total available bandwidth, or the like.

In an example embodiment where 32 samples are provided in each primary cache line 265, when bit 4 of the delay line memory address matches the transport trigger address bit 370, and no request is pending, a request to obtain further sample data from the main delay line memory 341 may be generated. For example in the example embodiment shown in FIG. 6, the delay module 304 may request data from the main delay line memory 341 via the transport bus 316 and the audio memory transport module 324. When bit 4 of the delay line memory address of a particular audio channel (identifying memory locations in an associated primary cache line 265) matches the transport trigger address bit 370 of the primary cache control register 350, and no request is pending, the primary delay line cache 264 may submit a request to the secondary delay line cache 266, a request pending (RP) bit 372 of the primary cache control register 350 may be set and the transport trigger address bit 370 may be incremented.

Example Primary Cache Line Request Generation Method

Figure 14:
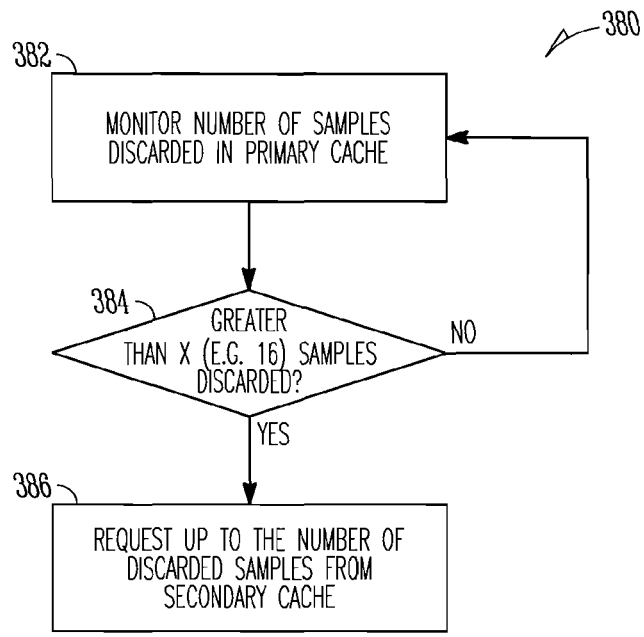
FIG. 14 shows an example method of implementing request logic for updating primary delay line cache memory with sample data from secondary delay line cache memory.

Referring to FIG. 14, reference numeral 380 generally indicates an example method, in accordance with an example embodiment, for implementing request logic for updating primary delay line cache memory with sample data from the main memory. The method 380 may be used to update any number of samples (e.g., sample blocks) and is not restricted to blocks of 16 samples, as described by way of example above. The method 380 may, for example, be used to read any number and configuration of data samples from the delay lines 274 (see FIG. 9) in the main delay line memory 341, via the secondary delay line cache 266, into the primary delay line cache 264 provided, for example, in the example delay module 304.

As shown at operation 382, a controller (e.g. the delay line cache controller 206) may, for example, monitor the number of discarded samples remaining in a primary cache line 265. The term "discarded samples" is intended to include samples which have already been read or used and thus the value of the sample may no longer be of any significance.

In an example embodiment as described above, each primary cache line 265 is divided into at least two sample blocks (e.g. sample blocks 0 to 15 and sample blocks 16 to 31) that are refreshed (via the secondary delay line cache 266) with read data from the main delay line memory 341 in a burst fashion. For example, when there are greater than a chosen number (e.g. 16) of discarded samples remaining in any primary cache line 265, then the delay line cache controller 206 may request up to the number of discarded samples from the main delay line memory 341 (see decision operation 384). For simplicity, the delay line cache controller 206 may simply request the chosen number (e.g. 16) of samples, even if the primary delay line cache contains more than this number of discarded samples. If, however, less than the chosen number of discarded samples remains in the primary cache line 265, then the method 380 returns to operation 382.

Example Secondary Delay Line Cache

Figure 15:
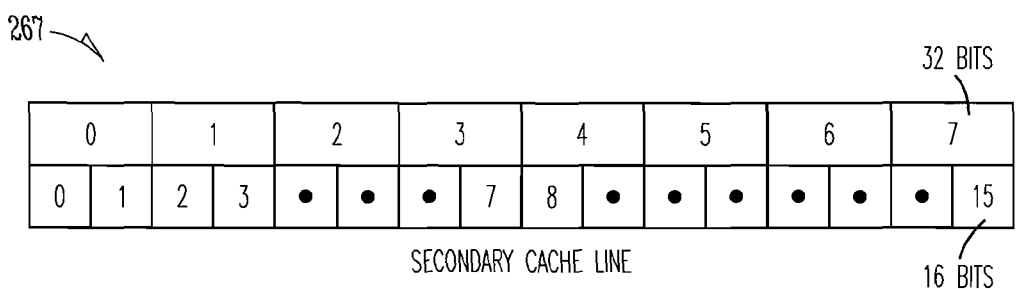
FIG. 15 shows a schematic representation of multiple secondary cache lines implemented in cache memory.

The secondary delay line cache 266 may include a plurality of secondary cache lines 267 (see FIG. 15) that are arranged dynamically per address associated with the main delay line memory 341. When the delay line cache 167 forms part of the delay module 304 (see FIG. 6) of the signal processing subsystem 300, the secondary delay line cache 266 may communicate with the main delay line memory 341 via the transport bus 316. In an example embodiment, as described in more detail below, each secondary cache line 267 has a secondary cache line address tag 367 (see FIG. 13) corresponding to its start address within the main delay line memory 341. In an example embodiment, the address tag is used both to request a read or a write operation with main delay line memory 341 and to facilitate matching incoming requests from the primary delay line cache 264. Thus, in certain circumstances as described in more detail below, a request from a primary cache line 265 that has a matching address may be fulfilled immediately from the matching secondary cache line 267.

Circumstances may arise in which the secondary delay line cache 266 will reject a request for samples from the primary delay line cache 264 if no cache lines are available in the secondary delay line cache 266 for use. By way of example, there may be a small number (e.g. 16) of secondary cache lines 267 relative to the number of primary cache lines (e.g. 1024). In this case, it is likely that the primary delay line cache 264 will submit more requests (e.g. more than 16) than the secondary delay line cache 266 can hold. Thus, when the primary delay line cache 264 submits a $17^{th}$ request before any of the first 16 have been fulfilled, no cache lines may be available in the secondary delay line cache 266. In that case, the request may be rejected. In an example embodiment, under these circumstances the delay line cache controller 206, in response to a request being rejected, may set a request rejected bit (RR) 374 in the primary cache control register 350. Accordingly, the request rejected bit 374 may indicate that the request from the primary delay line cache 264 should be regenerated regardless of a current state of the request pending bit 372, and that the comparison with the transport trigger address bit 370 should be ignored.

In certain example embodiments, the primary cache lines 265 in the primary delay line cache 264 may be set up for read-sum-and-write operations. In an example embodiment, the read-sum-and-write operations may be performed in a burst fashion during a burst write to the secondary delay line cache 266. For example, the secondary delay line cache 266 may perform a burst read (from the main delay line memory 341), a summation (in the secondary delay line cache 266), followed by a subsequent burst write back to the main delay line memory 341, as described in more detail below. For example, in the signal processing subsystem 300, the burst read and subsequent burst write may be via the transport bus 316 and the memory transport module 324.

Once a data transfer operation between the primary delay line cache 264 and the secondary delay line cache 266 via the bus 268 is completed (see FIG. 8), the primary delay line cache 264 (or the delay line cache controller 206) may clear the request pending bit 372. In an example embodiment, as far as the primary delay line cache 264 is concerned, the data transfer operation to the secondary delay line cache 266 is regarded as complete even if the secondary delay line cache 266 has not transferred the data to the main delay line memory 341 (e.g. via the transport bus 316). Accordingly, the secondary delay line cache 266 may be responsible for finalizing the data communication to the main delay line memory 341 and no explicit notification or acknowledgement that the transfer of the data to the main delay line memory 341 may be provided to the primary delay line cache 264. Thus, in an example embodiment, the primary delay line cache 264 may only "see" the secondary delay line cache 266 and not the main delay line memory 341.

Example Management of Primary Cache Requests

As mentioned above, the secondary delay line cache 266 may be provided between the main delay line memory 341 and the primary delay line cache 264. The secondary delay line cache 266 may accept a request from the primary delay line cache 264 and, in response thereto, generate transport requests for data from the main delay line memory 341. For example, in the digital processing subsystem 300, a transport request from the delay module 304 may be communicated to the audio memory transport module 324 via the transport bus 316. In an example embodiment of the secondary delay line cache 266, 16 secondary cache lines 267 (see FIG. 15) may be provided each comprising, for example, eight DWORDS that are dynamically allocated and associated with addresses in the main delay line memory 341. As described in more detail below, in an example embodiment the secondary delay line cache 266 provides a "window" to the data in the main delay line memory 341

Figure 16:
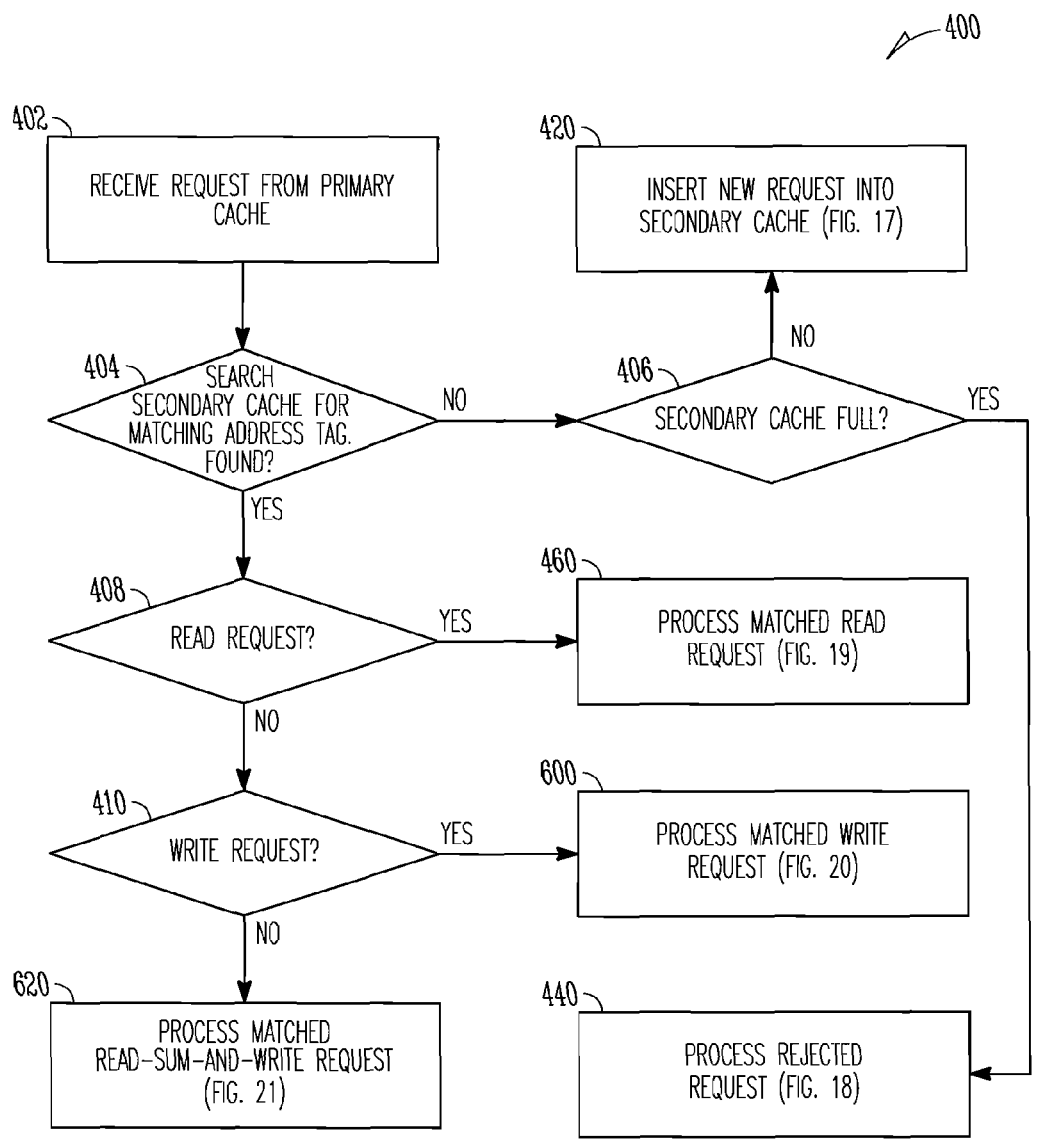
FIG. 16 shows an example method, in accordance with an example embodiment, for managing data in an example delay line via primary and secondary delay line caches.

Referring in particular to FIG. 16, reference numeral 400 generally indicates an example method, in accordance with an example embodiment, for managing data in a delay line via primary and secondary caches. As shown at operation 402, when a request for data is received by the secondary delay line cache 266 from the primary delay line cache 264, a check is performed to determine if an address associated with the request matches an address tag of a secondary cache line 267 (see decision operation 404). If no match is found, then a check is performed to determine whether or not the secondary delay line cache 266 is full (see decision operation 406). If the secondary delay line cache 266 is not full, then the request from the primary delay line cache 264 may be inserted into a secondary cache line 267 according to an example method 420, also in accordance with an example embodiment (see FIG. 17). If, however, the secondary delay line cache 266 is full, then it may process the request as rejected according to an example method 440, also in accordance with an example embodiment (see FIG. 18). Referring back to decision operation 404, if the address associated with the request matches the address tag of a secondary cache line 267, then a further determination is made to select the appropriate method to process the new request. If the new request received at operation 402 is a read request (see decision operation 408), then the secondary delay line cache 266 processes a matched read request according to an example method 460, also in accordance with an example embodiment (see FIG. 19). If the new request received at operation 402 is a write request (see decision operation 410), then the secondary delay line cache 266 processes a matched write request according to an example method 600, also in accordance with an example embodiment (see FIG. 20). If the new request received at operation 402 is neither a read nor a write request, then the secondary delay line cache 266 processes a matched read-sum-and-write request according to an example method 620, also in accordance with an example embodiment (see FIG. 21).

Figure 17:
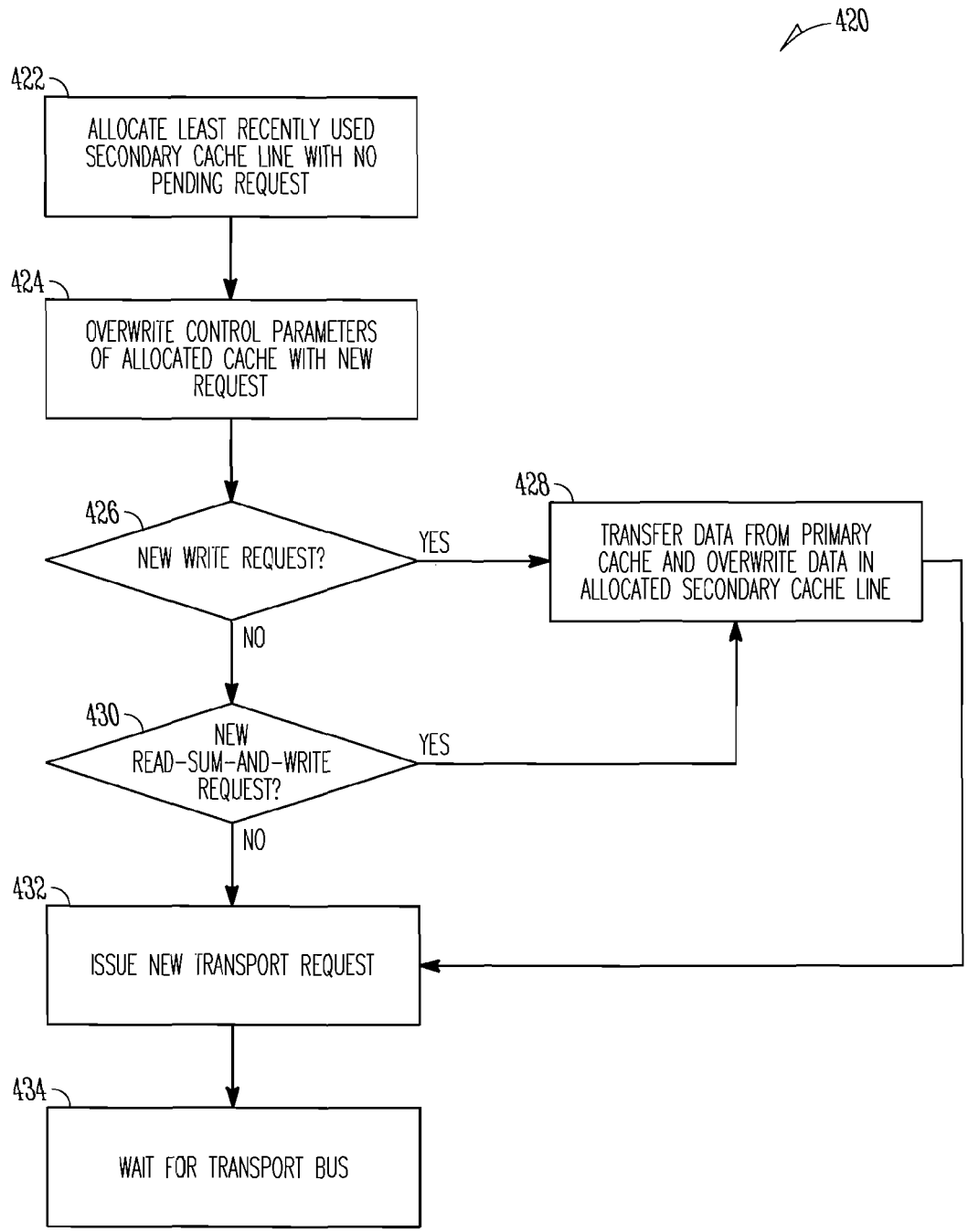
FIG. 17 shows an example method, in accordance with an example embodiment, for inserting a new request into a secondary cache line when an address does not match the address tag of any secondary cache line.

Referring to FIG. 17, reference numeral 420 generally indicates an example method, in accordance with an example embodiment, for inserting a new request into a secondary cache line 267 when the address does not match the address tag of any secondary cache line 267. In an example embodiment, to provide an enhanced benefit from caching, the secondary delay line cache 266 allocates the least recently used secondary cache line 267 with no pending transport request as shown in operation 422. Then as shown in operation 424, the secondary delay line cache 266 may overwrite the control parameters of the allocated secondary cache line 267 with those of the new request. If the new request is a write request (see decision operation 426) or a read-sum-and-write request (see decision operation 430), then the secondary cache line 267 is immediately overwritten with data transferred from the primary delay line cache 264 (see operation 428). If the new request is a read request, or the data transfer operation 428 is complete, then the secondary delay line cache 266 issues a new transport request (see operation 432) and then waits for a response from the transport bus (see operation 434). Thus, the method 420 may be used to insert new requests from the primary delay line cache 264 into a secondary cache line 267.

Figure 18:
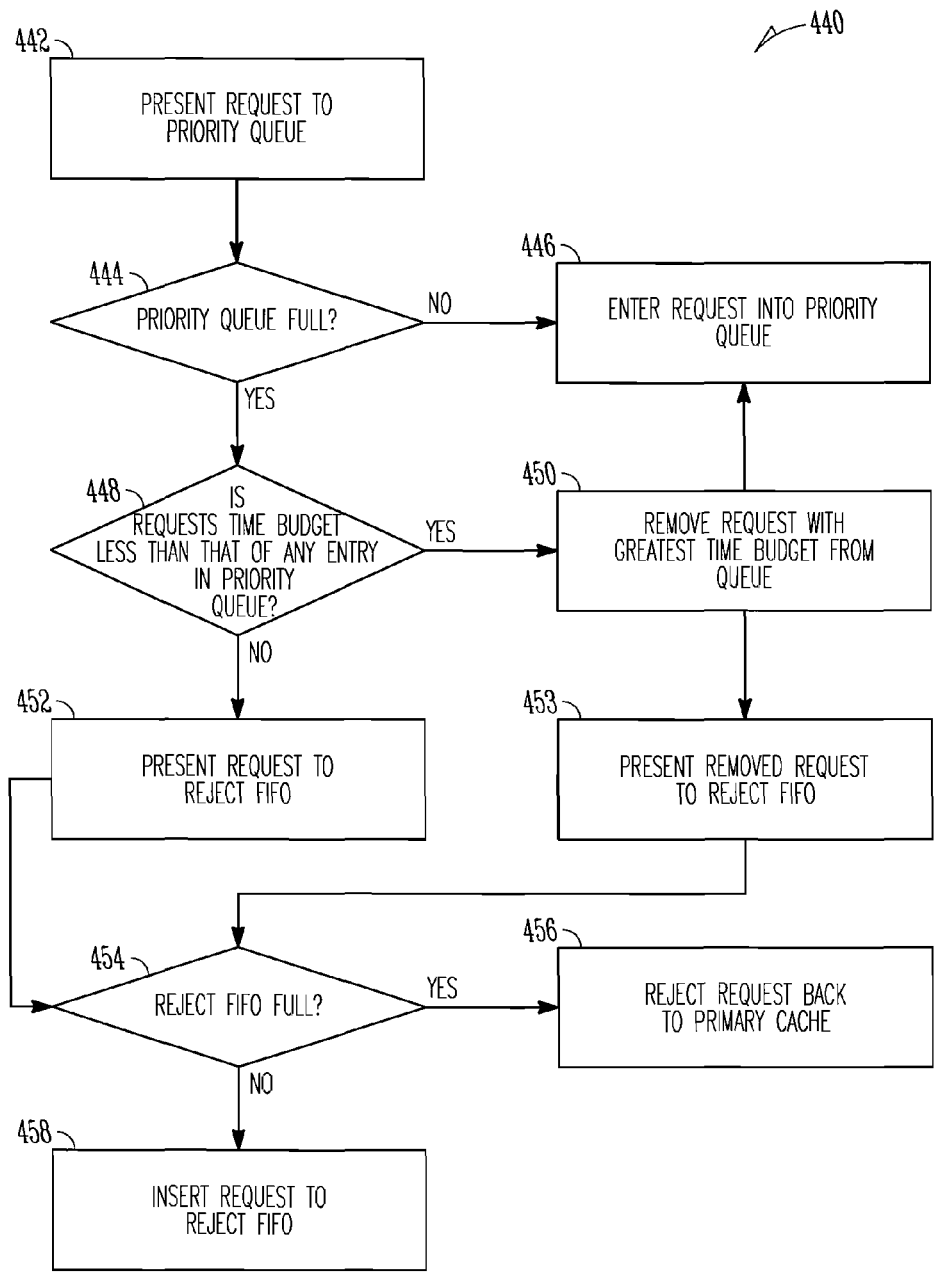
FIG. 18 shows an example method, in accordance with an example embodiment, for processing the rejection of a new request.

Referring to FIG. 18, reference numeral 440 generally indicates an example method, in accordance with an example embodiment, for processing the rejection of a new request. The secondary delay line cache 266 may first present the request to a priority queue as shown in operation 442. If the priority queue is not full (see decision operation 444), then the request is entered into the priority queue (see operation 446). If the priority queue is full, then it compares the time budget of the new request with the time budgets of the entries in the queue. If the time budget of the new request is less than that of at least one of those in the queue (see decision operation 448), the request with the greatest time budget may be removed from the queue at operation 450 and the new request may be entered into the queue at operation 446. Further, to improve performance when many requests are presented in quick succession followed by relatively long idle periods with no requests, requests may be entered into a reject FIFO rather than immediately rejected to the primary delay line cache 264. This reject FIFO may hold a plurality (e.g. 128) of requests in the order received without respect to the time budget. Thus, the request removed at operation 450 may be presented to a reject FIFO at operation 453. Referring back to decision operation 448, if the time budget of the new request is not less than that of any entry in the queue, the new request may be presented to a reject FIFO at operation 452. If the reject FIFO is full (see decision operation 454), the request presented to it, whether new or removed from the priority queue, may be rejected back to the primary delay line cache 264 at operation 456. If the reject FIFO is not full, the request presented to it may be inserted at operation 458. Thus, the method 440 may be used to process rejection of requests from the secondary delay line cache 266 back to the primary delay line cache 264.

Figure 19:
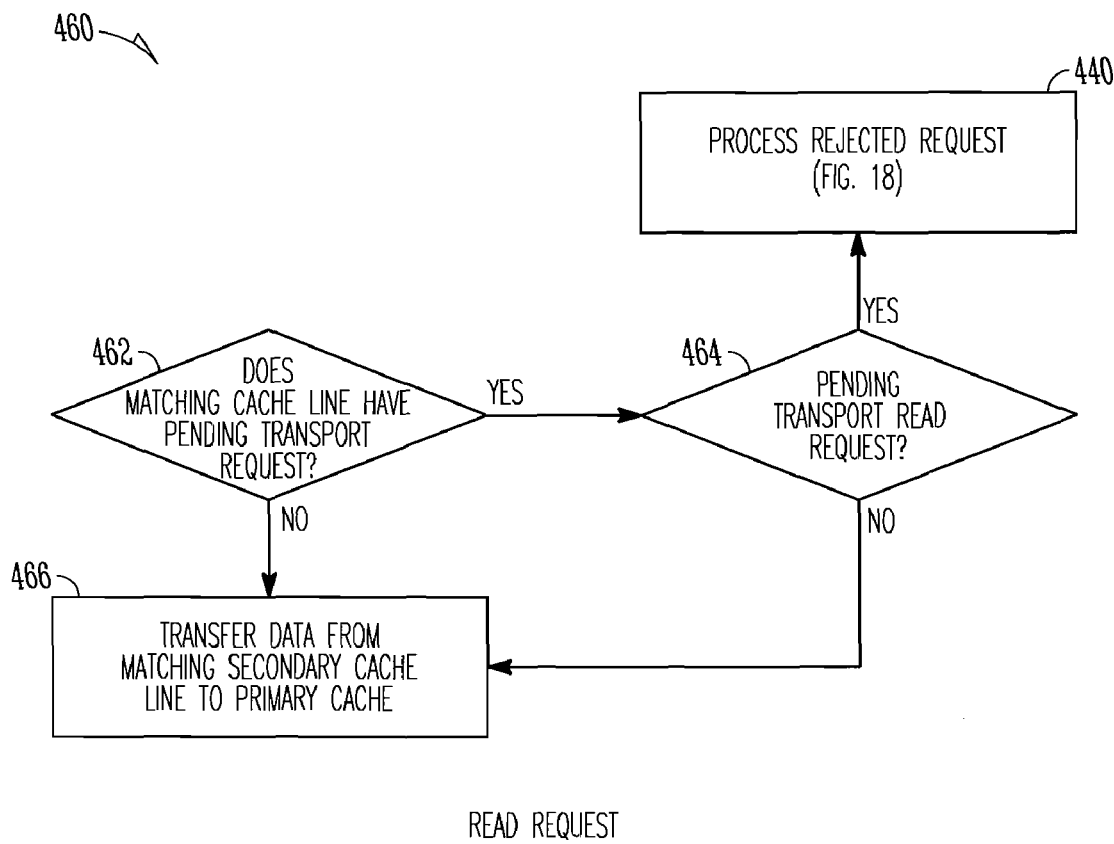
FIG. 19 shows an example method, in accordance with an example embodiment, of processing a read request by a primary delay line cache to read data from a secondary delay line cache when an address matches the address tag of a secondary cache line.

Referring to FIG. 19, reference numeral 460 generally indicates an example method, in accordance with an example embodiment, for processing a new read request that matches the address tag of a secondary cache line 267. If the matching secondary cache line 267 has no transport request pending (see decision operation 462), or the pending transport request is not a read request (see decision operation 464), then the secondary delay line cache 266 immediately transfers the data from the secondary delay line cache 266 to the primary delay line cache 264 as shown at operation 466, fulfilling the request. If the matching cache line has a pending transport read request, the new request is processed as rejected according to the method 440. It should be noted that in an example embodiment the decision operation 464 compares the transport request type, not the primary cache request type. Thus, a read-sum-and-write primary cache request may have a pending transport read request, leading to rejection according to the method 440. Likewise, a read-sum-and-write request may have a pending transport write request, allowing data transfer at operation 466. For clarity, the text refers to primary cache requests as simply "requests" and to transport requests as "transport requests," "transport read requests," and "transport write requests". Thus, the method 460 may be used to process new read requests from the primary delay line cache 264 that match the address tag of a secondary cache line 267.

Figure 20:
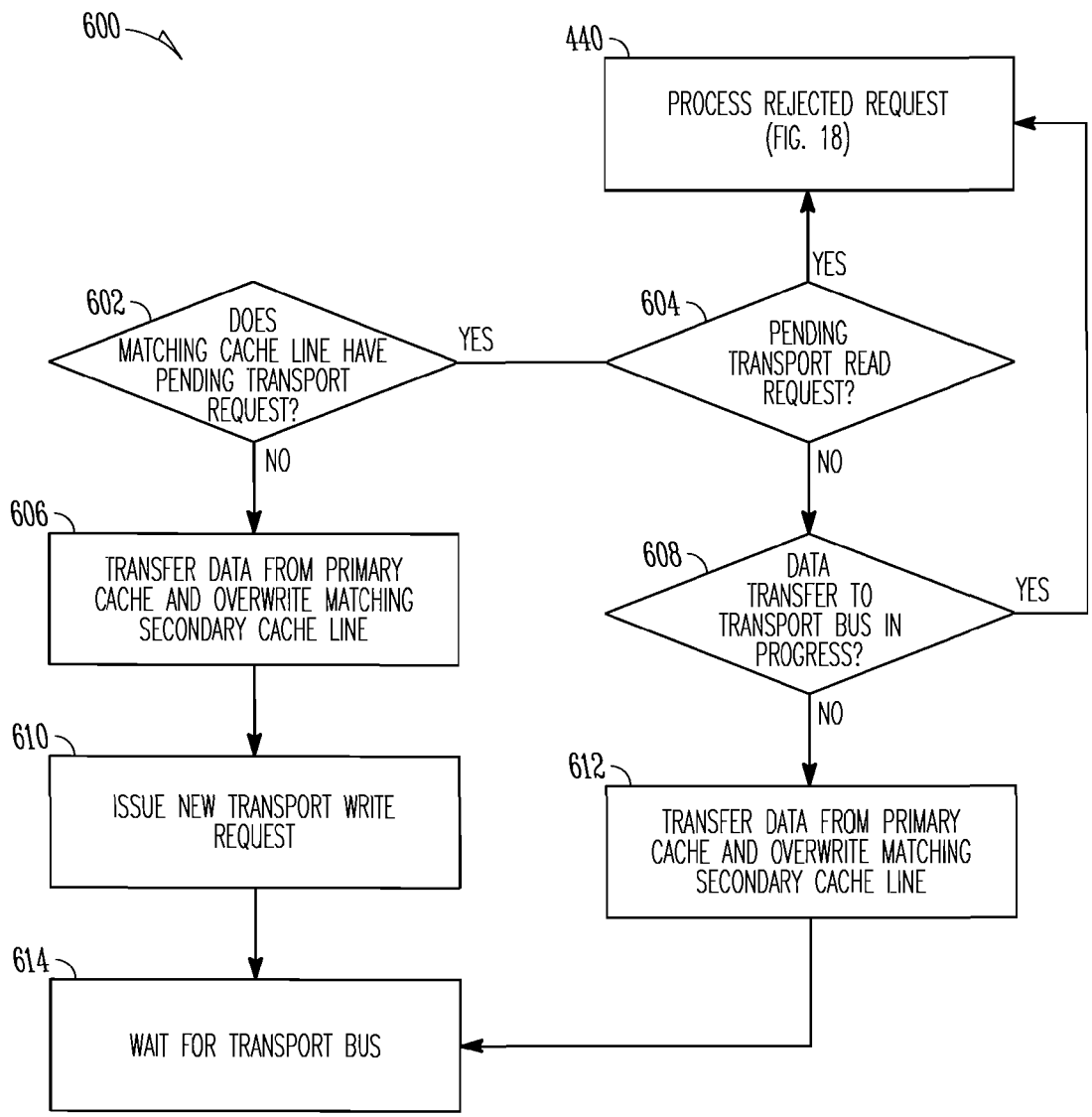
FIG. 20 shows an example flow diagram of a method, in accordance with an example embodiment, of processing a write request from a primary delay line cache to write data to a secondary delay line cache when the address matches the address tag of a secondary cache line.

Referring to FIG. 20, reference numeral 600 generally indicates an example method, in accordance with an example embodiment, for processing a new write request that matches the address tag of a secondary cache line 267. If the matching secondary cache line 267 has no transport request pending (see decision operation 602), then the secondary cache line 267 may be immediately overwritten with data transferred from the primary delay line cache 264 as shown at operation 606. Then the secondary delay line cache 266 may issue a new transport request in operation 610 and wait for the transport bus to respond as shown in operation 614. If, however, the matching cache line has a pending transport read request (see decision operation 604), the new request is processed as rejected according to the example method 440. If the matching cache line has a pending transport write request and data transfer to the transport bus is in progress (see decision operation 608), the new request is processed as rejected according to the method 440. Otherwise, the secondary cache line 267 may be immediately overwritten with data transferred from the primary delay line cache 264 as shown at operation 612. In this case, a transport request was already pending, so the secondary delay line cache 266 may wait for the transport bus as shown in operation 614 as it had been prior to receiving the new matching request. Thus, the method 600 may be used to process new write requests from the primary delay line cache 264 that match the address tag of a secondary cache line 267.

Figure 21:
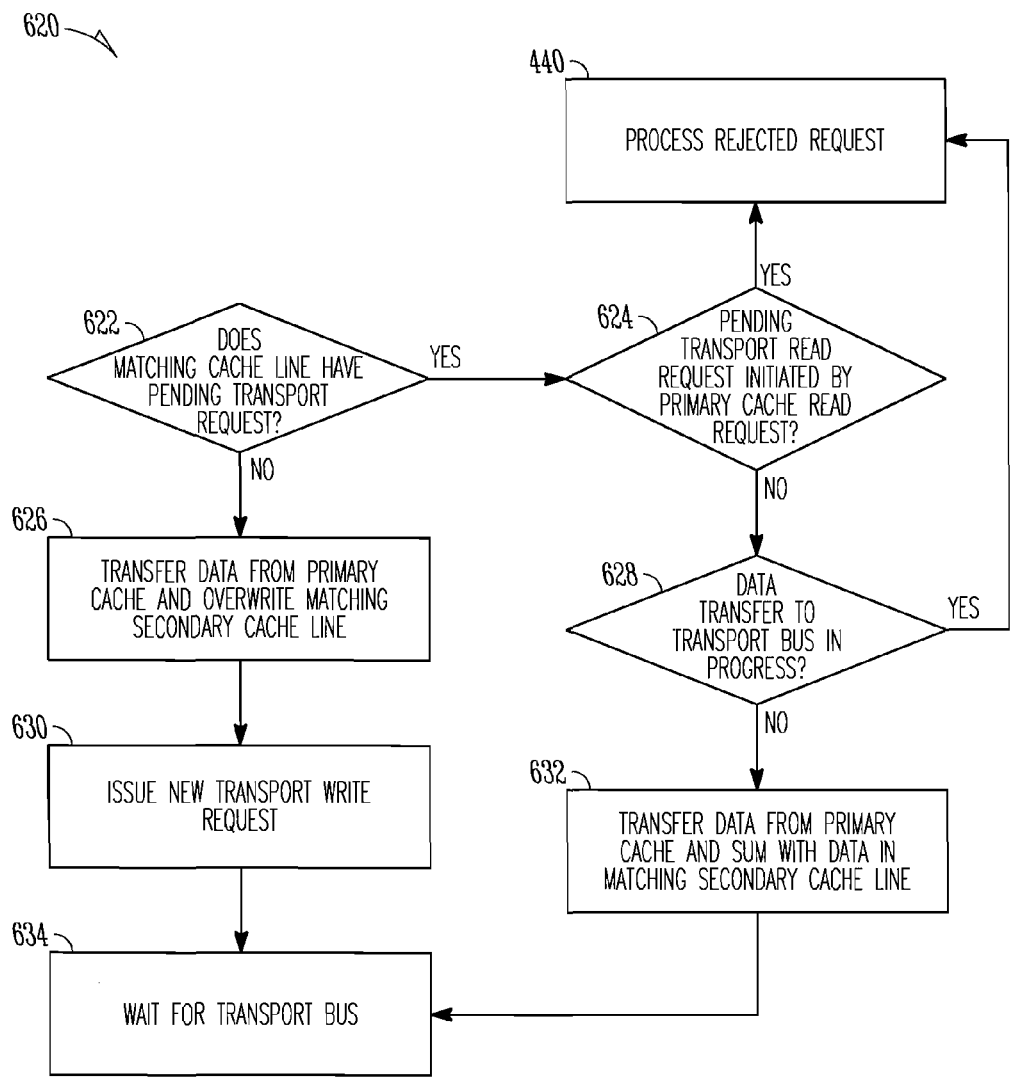
FIG. 21 shows an example flow diagram of a method, in accordance with an example embodiment, of processing a read-sum-and-write request from a primary delay line cache to write data to a secondary delay line cache when the address matches the address tag of a secondary cache line.

Referring to FIG. 21, reference numeral 620 generally indicates an example method, in accordance with an example embodiment, for processing a new read-sum-and-write request that matches the address tag of a secondary cache line 267. If the matching secondary cache line 267 has no transport request pending (see decision operation 622), then data is immediately transferred from the primary delay line cache 264 and summed with the data in the secondary cache line 267 as shown at operation 626. Then the secondary delay line cache 266 may issue a new transport request in operation 630 and waits for the transport bus to respond as shown in operation 634. If, however, the matching secondary cache line 267 has a pending transport read request initiated by a primary cache read request (see decision operation 624), the new request is processed as rejected according to the method 440. Note that in an example embodiment the decision operation 624 compares with the primary cache request, and thus will not proceed to rejection if the matching cache line has a pending transport read request initiated by a primary cache read-sum-and-write request. If the matching cache line 267 has a pending transport write request and data transfer to the transport bus is in progress (see decision operation 628), the new request is processed as rejected according to the method 440. Otherwise, data is immediately transferred from the primary delay line cache 264 and summed with the data in the secondary cache line 267 as shown at operation 632. In this case, a transport request was already pending, so the secondary delay line cache 266 simply waits for the transport bus as shown in operation 634 as it had been prior to receiving the new matching request. One should note that, in an example embodiment, a primary difference between the method 620 and the method 600 is that in method 620, read-sum-and-write requests may transfer data while a transport read request is pending, provided that the transport read request was initiated by another read-sum-and-write request. Another difference in this example embodiment is that the transferred data is summed into the cache in the method 620 whereas the transferred data overwrites the cache in the method 600. Thus, the method 620 may be used to process new read-sum-and-write requests from the primary delay line cache 264 that match the address tag of a secondary cache line 267.

Thus, by means of incorporating the example methods 420, 440, 460, 600, and 620, the method 400 may be used to manage requests from the primary delay line cache 264 to the secondary delay line cache 266. In an example embodiment when the transport bus 316 is time-multiplexed, in the event of transport write slots arriving at the same time as a write request or read-sum-and-write request to the same secondary cache line 267 in the secondary delay line cache 264, the write slots may be left unfilled and may require the memory transport module 324 to resend the transport write slots via the transport bus 316. As mentioned above, it will be appreciated that the primary/secondary delay line cache arrangement shown in FIG. 8 need not be restricted to a ring configuration of signal processor modules (see FIG. 6) but may apply in any configuration, for example, the signal processing subsystem 200 (see FIG. 5).

Example Read-Sum-and-Write Functionality

Figure 22:
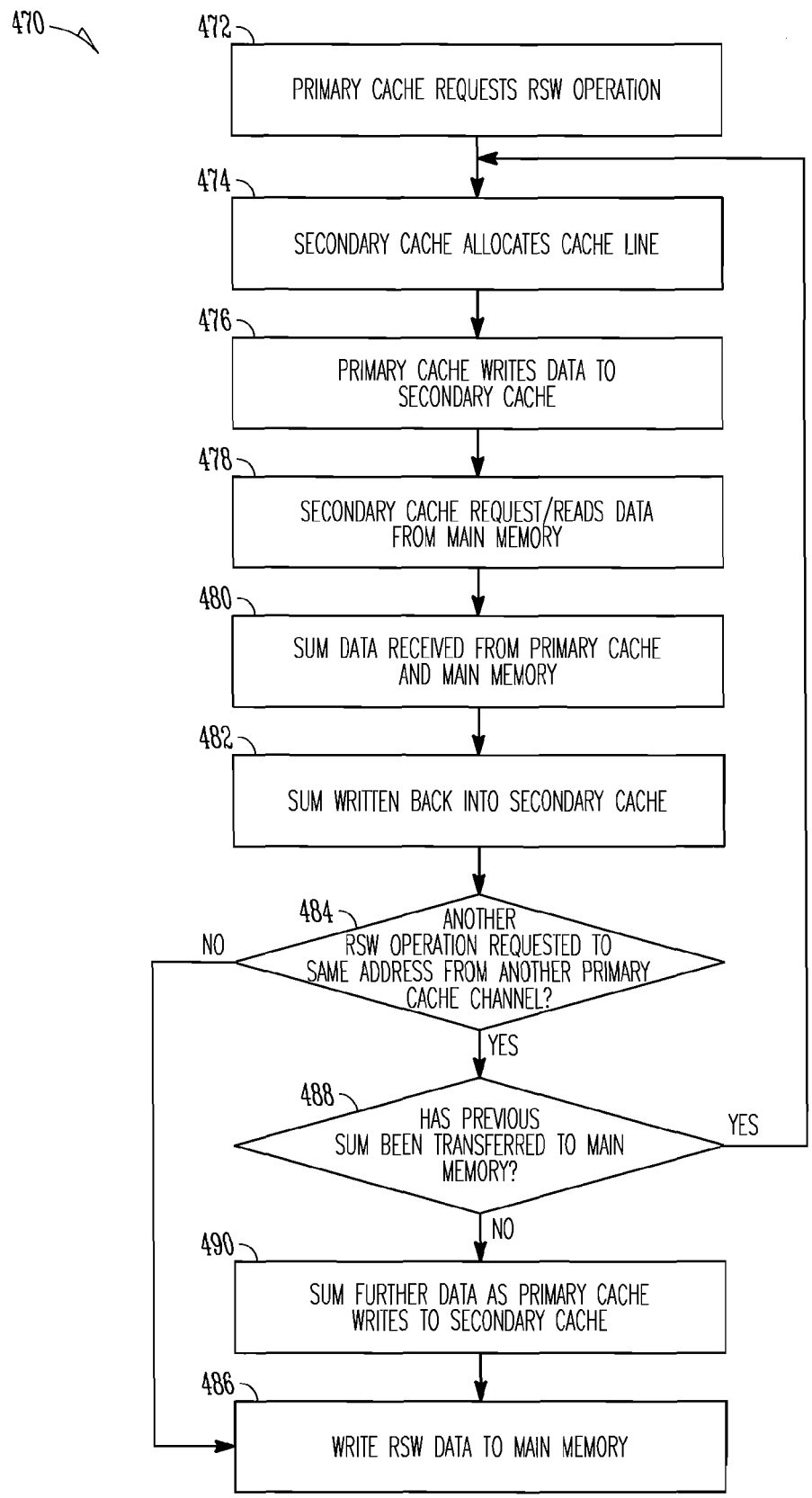
FIG. 22 shows a example flow diagram of a method, in accordance with an example embodiment, of processing a read-sum-and-write request from the primary delay line cache to read, sum and write data to delay lines in the main memory.

Referring to FIG. 22, reference numeral 470 generally indicates a further example method, in accordance with an example embodiment, of performing read-sum-and-write (RAW) operations in secondary cache, for example, the secondary delay line cache 266. As read-sum-and-write operations require both reading from and writing to a memory location in the main delay line memory 341 implementing a delay line, they may require double the bandwidth of a single read or write operation. In an example embodiment, the read-sum-and-write functionality may be performed or executed in the secondary delay line cache 266 and the result thereof transferred to the main delay line memory 341. The operation may be viewed essentially as a write operation in so far as the primary delay line cache 264 is concerned. Thus, for example, in the ring configuration of the subsystem 300 of FIG. 6, data samples may be transferred to the delay module 304 from the DSP module 302, the digital I/O module 312, the sample rate converter module 306, the filter module 308, and the mixer module 310 via the audio bus 318. Upon receipt of the sample data, the delay module 304 may store the data in the primary delay line cache 264 for subsequent communication to an appropriate delay line in the main delay line memory 341. When performing an RAW operation, the data from the main delay line memory 341 must first be read and, thereafter, the data received from the primary delay line cache 264 must be summed with the data read from the main delay line memory 341. Finally the resulting summation is then written back (post-written) to an associated delay line 274 in the main delay line memory 341 (see FIG. 9). As mentioned above, the read-sum-and-write functionality may be performed in the secondary delay line cache 266. Accordingly, multiple read-sum-and-write operations to addresses that are close to each other in the main delay line memory 341 can occur with minimal external bus bandwidth (e.g., of the communication bus 220 (see FIG. 8)). In an example embodiment, multiple read-sum-and-write operations to the same addresses can occur without overwrite hazards that may result in lost data. Since each primary cache line 265 is associated with an audio channel, there may be no way for the primary delay line cache 264 to detect multiple read-sum-and-write operations to the same address. Consequently, it may be possible to issue multiple requests to the same address and, depending on the request completion order, the final write-back of one read-sum-and-write request may overwrite that of another, creating an overwrite hazard. An address-associative secondary delay line cache 266 may detect multiple requests to the same address and inhibit such overwrite hazards, thus to provide data coherency between the multiple channels of primary cache.

Returning to the method 470, as shown at operation 472 the method 470 may commence when the primary delay line cache 264 requests an RSW operation. The request from the primary delay line cache 264 may identify the address of the data sample in the main delay line memory 341 to be operated upon (e.g., via the address tags discussed above). Upon receipt of the request from the primary delay line cache 264, the secondary delay line cache 266 may allocate a cache line (see operation 474) and, thereafter, the primary delay line cache 264 may write the sample data to the secondary delay line cache 266 (see operation 476). The secondary delay line cache 266 may then request or read data from the main delay line memory 341 (see operation 478). As mentioned above, in the example subsystem 300 of FIG. 6 the secondary delay line cache 266 may request/read data from the main delay line memory 341 via the transport bus 316 and the memory transport module 324.

Once the secondary delay line cache 266 receives the appropriate data from a corresponding delay line 274 in the main delay line memory 341, it is summed with the data received from the primary delay line cache 264 as shown at operation 480. Thereafter, the sum of the data is written back into the secondary delay line cache 266 (see operation 482). Thereafter, if no further RSW operation has been requested to the same address in the main delay line memory 341 (and thus the same delay line 274) from another primary cache channel (see decision operation 484), then the RSW data in the secondary delay line cache 266 is written (post-written) to the main delay line memory 341 as shown at operation 486. If, however, there is another RSW operation requested to the same delay line address from another primary cache channel then, as shown at decision operation 488, a determination is made whether or not a previous sum has been transferred to the main memory and, if so, the method 470 returns to operation 474. If, however, the previous RSW sample data has not been transferred or communicated to the main memory (e.g., via the transport bus 316 and the memory transport module 324) then the further sample data received from the primary delay line cache 264 may be summed with the previous RSW data and written to the secondary delay line cache (see operation 490). Thereafter, the RSW sample data may be written to the main delay line memory 341 (e.g., via the transport bus 316).

In an example embodiment, if a write data transfer to the main delay line memory 341 (e.g., via the transport bus 316) is partially complete on a read-sum-and-write cache line in the secondary delay line cache 266, any RSW requests from the primary delay line cache 264 to the same address may be rejected. Accordingly, the likelihood of writing any incomplete buffers (implementing delay line caches) to the main delay line memory 341 may be at least reduced. In a boundary case, if transport write slots (for writing data to the main delay line memory 341) of the transport bus 316 arrive at the same time as a RSW request is presented to a secondary cache line 267, the write slots may be left unfilled and the delay module 304 may require the memory transport module 324 to resend the write slots via the transport bus 316. In an example embodiment, a final write (post-write) to the main delay line memory 341 implementing the delay lines, may optionally be delayed until all RSW operations have been completed in a particular secondary cache line 267 of the secondary delay line cache 266.

Figure 13:
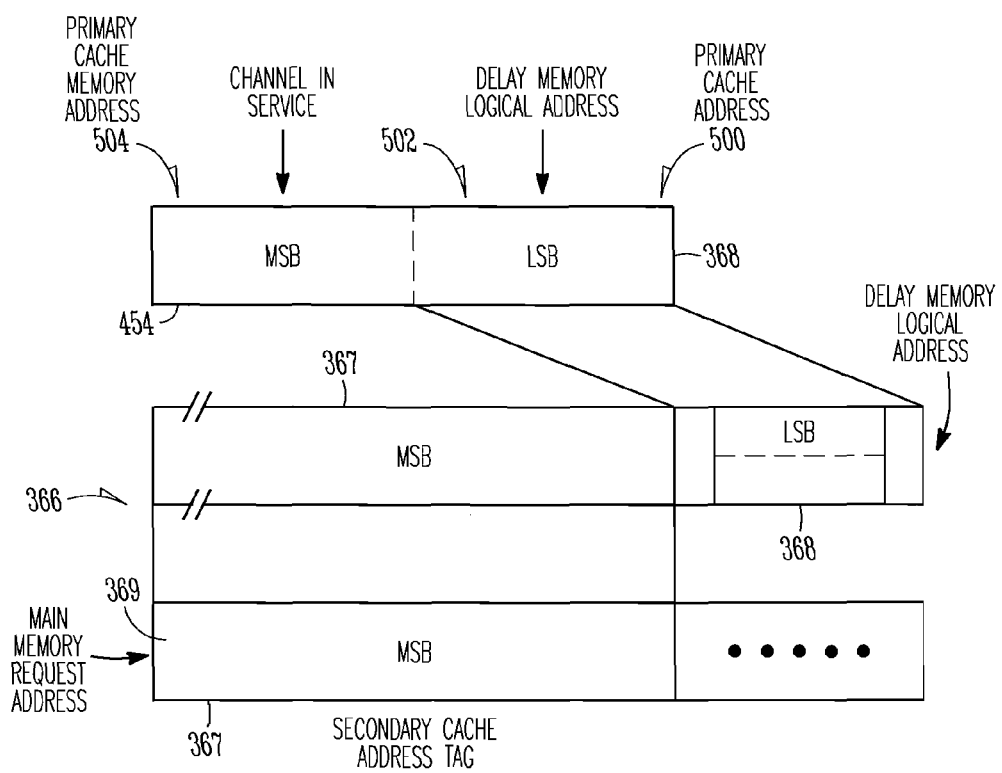
FIG. 13 shows example addressing of delay line caches and main delay line memory implementing the external delay lines.

As mentioned above, each cache line provided in the secondary delay line cache 266 may have an associated address tag, for example, a secondary cache line address tag 367 (see FIG. 13). In certain example embodiments, several status and control bits may also be provided (not shown in FIG. 13). In certain example embodiments, when primary cache lines 265 in the primary delay line cache 264 correspond to channels (e.g. audio channels on the audio bus 318), the memory within the primary delay line cache 264 (see FIG. 8) may be divided into equal sized regions, one region per channel. In such example embodiments, a memory address 500 (see FIG. 13) for accessing individual samples within the primary delay line cache 264 may include a sample address identification field 502 and a channel identification field 504. In an example embodiment, the sample address identification field 502 may be equal to the least significant bits (LSB) 368 of a delay memory logical address 366. In an example embodiment, a main memory address 369 may provided by the most significant bits (MSB) of the delay memory logical address 366 and 5 bits of zeroes. The MSB bits may then be used as a secondary cache address tag. When the channels are provided on the audio bus 318 in a time-multiplexed fashion, the channel identification field 504 may indicate a channel in service. When requesting service, the primary delay line cache 264 may present the channel identification field 504 to the secondary delay line cache 266. The secondary delay line cache 266 may use the channel identification field 504 to associate a secondary cache line 267 with a primary cache line 265. Thus, when the secondary delay line cache 266 transfers data to or from the primary delay line cache 264, it may present the channel identification field to indicate the primary delay line cache channel to which the data transfer should be directed. As described in more detail below, in an example embodiment the secondary cache line address tag 367 may include an age field that is used to implement the least recently used allocation scheme (see operation 422 in FIG. 17). For example, each time a cache channel (corresponding to a primary cache line 265) of the primary delay line cache 264 uses a secondary cache line in the secondary delay line cache 266, the age field in the secondary cache line address tag 367 may be reset. The age field may be used when multiple main memory addresses are close to each other such that they point to the same region of the main delay line memory 341 that fits within a particular cache line. In these cases, it may be desirable to delay reallocation of a secondary cache line 267 to increase the possibility of an address tag match, thus improving bus efficiency by reducing redundant requests to the same address. The least recently used allocation scheme may use the age field to select a secondary cache line for allocation, always selecting the oldest secondary cache line, i.e. the one with the greatest age. In certain example embodiments, the aging functionality may be disabled for individual delay line accesses if it is not possible for multiple delay line addresses to be close enough to each other so that they fit within a cache line. Thus, for example, if read and write pointers for a delay line in the secondary delay line cache 266 are further apart than a predetermined number of memory locations (e.g., 8DWORDS), and there is no possibility that the pointers will modulate (dynamically change) so they are closer than the predetermined number of memory locations, then an age enable (AE) bit may not be set in a delay line control register (as described in more detail below). If two pointers are closer together, but belong to different logical delay lines, such as at the boundary between two separate delay lines, then the age enable bit need not be set. When the age enable bit is not set, the age may be automatically set to maximum. In this way, the least recently used allocation scheme will prefer allocating secondary cache lines for which the age enable bit is not set, thus increasing the duration a secondary cache line 267 for which the age enable bit is set may remain in the secondary delay cache 266, further increasing the possibility of an address match.

Example Pointer Distance Restrictions

It will be appreciated that, due to bus latency (e.g., latency of the buses 112, 212, 325 or the like) and thus the size of a secondary cache line 267, certain distance restrictions may arise with respect to the read and write pointers. As discussed above with reference to FIG. 9, a first pointer address of a delay line 274 may be the highest value of the pointer (the highest address location) within any particular delay line 274 and, as the required delay from the delay line 274 increases, the address of the read pointer may decrease (see arrows 278 and 280 in FIG. 9).

As the secondary delay line cache 266 may mirror a subset of the data samples in the delay lines 274 of the main delay line memory 341, in an example embodiment, a delay line write address may be greater than any RSW address by at least number of samples in one secondary cache line 267 plus a sample period. For example, the differences between the addresses may, in an example embodiment, equal 9 samples in a 32-bit sample mode, or 17 samples in a 16-bit sample mode. In certain circumstances if these example minimum distances are not observed, a possibility may arise that a delay line write operation could complete after a RSW operation that the delay line write should have preceded. In these circumstances, the data written to main delay line memory 341 by the RSW operation via the secondary delay line cache 264 may be overwritten by the write operation, causing the data written by the RSW operation to be lost.

Figure 23:
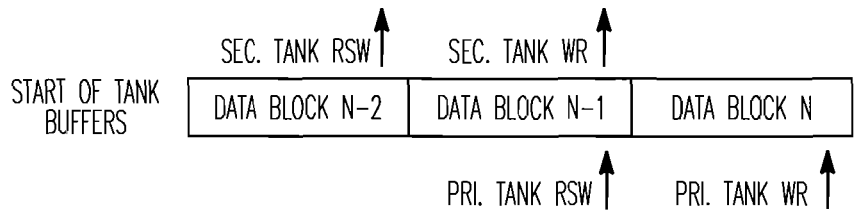
FIG. 23 shows example pointer restrictions between write and read-sum-write pointers at a start of a cache line in the secondary delay line cache.
Figure 24:
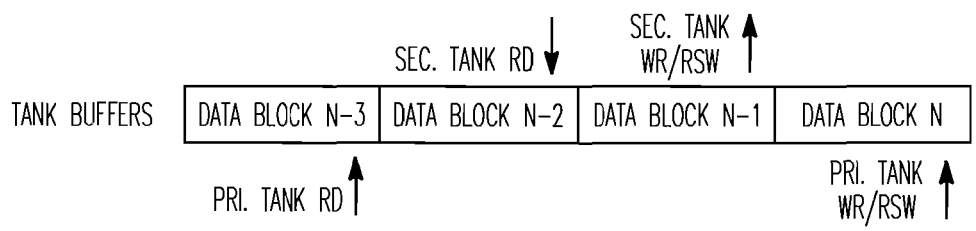
FIG. 24 shows example pointer restrictions between read and write/read-sum-write pointers within a cache line.

Referring to FIG. 23, in an example embodiment a delay line write or RSW pointer address in the secondary delay line cache 266 should be greater than any read pointer address in the same secondary cache delay line by, for example, at least 3 secondary cache lines plus a sample period which, in an example embodiment, may equal 25 addresses in a 32-bit mode or 49 addresses in a 16-bit mode. Accordingly, secondary delay line cache writes/RSW operations may always write or sum a cache line behind the one currently being sent to the primary delay line cache 264, and secondary delay line read operations may always read a cache line ahead of the one being fetched by the primary delay line cache 264. Thus for the given example, a minimum of 3 complete cache lines of separation may ensure that a delay line write/RSW and read will not collide with the same secondary cache line.

In circumstances where the abovementioned separation is not observed, a possibility may arise that the data written by the delay line write pointer may not be seen by the read pointer, or the data summed in by the RSW pointer may not be seen by the read pointer. Conversely, there may be no problem if a read pointer is placed at any pointer address higher than a RSW pointer as the read pointer may never see the data summed in by the RSW pointer.

In an example embodiment, there may be no restriction with respect to adjoining, independent delay line buffers that the read-ahead, as a write-behind strategy may ensure that the secondary cache line addresses passed from the primary delay line cache 264 to the secondary delay line cache 266 may be different from their associated buffers.

Example Secondary Cache Control Register

Figure 25:
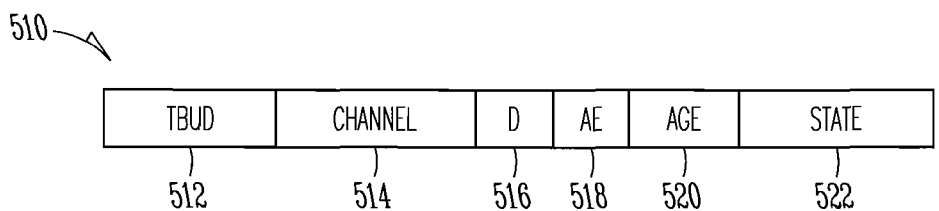
FIG. 25 shows an example secondary cache control register.

As mentioned above, a delay line cache controller (e.g., the delay line cache controller 206) may be provided. In an example embodiment, the delay line cache controller 206 may have a secondary cache control register 510 (see FIG. 25) including the following example data fields:

Time budget (TBUD [3:0]) 512—the time budget may specify a number of sample periods a delay line channel can tolerate before running out of primary delay line cache locations in the primary delay line cache 264. For example, the time budget may occupy 4 bits of the secondary cache control register 510.

Primary delay line cache channel (CHAN [9:0]) 514—this data may identify a channel (e.g., an audio channel) that generated a request associated with data in the primary cache line 265. For example, this data may occupy 10 bits of the secondary cache control register 510.

Dropped (D) 516—this data may indicate that a pending transport request has been dropped and should be re-issued after a re-issue timer has expired.

Age enable (AE) 518—age enable bits may enable the aging of data in a DATA_VALID state (see below). In an example embodiment, an age enable bit in the secondary cache control register 510 may be set at zero to indicate that the age should be set at a maximum as soon as the last data transfer has occurred, permitting the cache line to be reused.

Age of data (AGE [3:0]) 520—in an example embodiment, if a state is DATA_VALID (see below) the age data may indicate the time since last used by the primary delay line cache 264. The age data may be reset each time a cache hit is detected. In an example embodiment, if the D (dropped) bit is set, the age data may be used as a re-issue timer which may prevent the cache from issuing a transport request until the re-issue timer decrements to 0.

State (STATE [5:0]) 522—this data may identify a state of a secondary cache line in the secondary delay line cache 266. Example states of a secondary cache line 267 may include:

---

DATA_INVALID

READ16_INSERTED
READ16_PENDING
READ16_DATA_READY
WRITE16_INSERTED
WRITE16_ACK_DONE
WRITE16_PENDING
WRITE16_TRANSFERRING
READ32_INSERTED
READ32_PENDING
READ32_DATA_READY
WRITE32_INSERTED
WRITE32_ACK_DONE
WRITE32_PENDING
WRITE32_TRANSFERRING
DATA_VALID

RSW16_INSERTED
RSW16_WR_ACK_DONE
RSW16_READ_PENDING
RSW16_SUMMING
RSW16_SUMMING_RP
RSW16_WRITE_INSERTED
RSW16_WRITE_PENDING
RSW16_SUMMING_WP
RSW16_WRITE_TRANSFERRING
RSW32_INSERTED
RSW32_WR_ACK_DONE
RSW32_READ_PENDING
RSW32_SUMMING
RSW16_SUMMING_RP
RSW32_WRITE_INSERTED
RSW32_WRITE_PENDING
RSW32_SUMMING_WP
RSW32_WRITE_TRANSFERRING, and so on.

---

The age of data field (AGE) 520 maybe treated differently dependent upon the state of a secondary cache line. For example, if the cache line is in the DATA_VALID status, it may be incremented and represent a time since last usage of the secondary cache line by the primary delay line cache 264. In an example embodiment, if the age of data field 520 is in any _INSERTED state, it maybe decremented. In any _INSERTED state, the age field 520 may be treated as a re-issue timer and prevent transport bus requests from being issued until it has decremented to zero.

In an example embodiment, DATA_VALID cache lines may be aged. For example, to support a least-recently-used algorithm for selecting cache line locations (see operation 422 in FIG. 17) secondary cache lines may be aged. In an example embodiment, the age of data field 520 of the secondary cache control register 510 may be incremented 8 times per sample period (e.g., every 512 clocks) for read or write requests, and 4 times per sample period (e.g., every 1024 clocks) for read-sum-and-write requests as RSW requests may age more slowly. A secondary cache line allocation algorithm or process may choose an idle secondary cache line with the greatest value in the age field 520, except that cache lines flagged as data invalid may be chosen first. In an example embodiment, a bit is appended to the MSB of the age of data field 520 and a 5-bit comparison is performed to perform this test. This may have the effect of making invalid secondary cache lines appear older than valid cache lines and, accordingly, they may be allocated first. In an example embodiment, the age of data field 520 may be reset every time a secondary cache hit is detected.

As mentioned above, the age of data field 520 may be used to indicate or trigger a re-issue of a dropped transport request. In an example embodiment, the re-issue timer may be decremented every 32 clocks (e.g., 128 times per sample period) regardless of the type of request as long as the dropped bit is set in the secondary cache control register 510. In order to prevent wrap around, the age of data field 520 may saturate at a minimum value of 0. In an example embodiment, when the re-issue timer decrements to zero, a transport request may then be re-issued and the dropped bit may be reset. In order to reduce start-up delay, the bit in the Dropped (D) field 516 and the age of data field 520 may be set to zero when a request is initially inserted from the primary delay line cache 264. In an example embodiment, the age data field 520 is set to non-zero in the _INSERTED state in response to a dropped request notification.

It will however be appreciated by a person skilled in the art that any one or more of the above methods may be implemented by a state machine, the specific details of which may vary from embodiment to embodiment. Further, it will be appreciated that the above states are merely example states and that further states may be added or states may be removed in other embodiments.

Example Secondary Delay Line Cache Address Register

The delay line cache controller 206 may also include a secondary cache address register that includes address information of each secondary cache line in the secondary delay line cache 266. The secondary cache address register may include a logical byte address of data in each secondary cache line that may, for example, comprise 32 bytes. In an example embodiment, the secondary cache address register may serve as a secondary cache line address tag 367 (see FIG. 13) used to detect matching requests as in the method 400 (see FIG. 16). In an example embodiment, when the transport burst size is 8 DWORDS and each burst is aligned on an eight double word (DWORD) boundary, bits 5 to 24 may define the logical byte address of the data in the cache line and bits 0 to 4 may be zero. In this context, the term "DWORD" refers to 32-bit words, comprised of four 8-bit bytes. An eight DWORD quantity of data corresponds to thirty-two bytes. Since thirty-two bytes may be addressed with five bits, the five LSB bits 0 to 4 may be assumed to be zero for the start logical byte address within the main delay line memory 341 of the data within a secondary cache line 267.

In an example embodiment, secondary cache data is defined by 32 bits that correspond with 32-bit data in each secondary cache line. Each secondary cache line may thus, in an example embodiment comprise eight DWORDS.

Example Primary to Secondary Cache Bus Interface

As mentioned above, the primary delay line cache 264 may communicate via the communication bus 268 with the secondary delay line cache 266 (see FIG. 8). Further, in an example embodiment, the primary delay line cache 264 is arranged per channel and the secondary delay line cache 266 is arranged per address of a corresponding delay line in the main delay line memory 341. The primary delay line cache 264 may communicate with the secondary delay line cache 266 using a split request/acknowledge protocol. A channel number and a command code may accompany the request. An acknowledge signal from one of the primary or secondary delay line caches 264, 266 may return a channel number and a status code. In an example embodiment, a request and acknowledge for a single channel need not overlap and may be separated in time by several sample periods. However, in other example embodiments, a simultaneous request and acknowledge from different channels may take place.

In an example embodiment, six request command codes are provided, namely, READ16, WRITE16, RSW16, READ32, WRITE32, and RSW32. The secondary delay line cache 266 may require knowledge of the bit width of the logical word in order to, for example, support big-endian/little-endian modes. In addition, in an example embodiment, the secondary delay line cache 266 may perform the RSW operations and, accordingly, the secondary delay line cache 266 may split an adder (performing the summing) for 16 bit wide data.

In an example embodiment, three status codes may be provided, for example, READ_XFER, WRITE_XFER, and REQ_REJECT. The data may be transferred 32-bits per clock and, accordingly, there may not be a need to identify the bit-width of the request during an acknowledge cycle. When the actual data transfer to/from the primary delay line cache 264 is complete, the primary delay line cache 264 may reset the RP bit 372 (see FIG. 12) in the primary cache control register 350. The secondary delay line cache 266 may signal a REQ_REJECT status code if the secondary delay line cache 266 is full. The primary delay line cache 264 may react to this by setting the request rejected (RR) bit 374 (see FIG. 12) in the primary cache control register 350. Both the READ_XFER and WRITE_XFER status codes may be held active for several clock cycles. Read transfer may begin when the acknowledge cycle begins and continue until the acknowledge cycle ends.

In an example embodiment, a write data transfer may begin a number of clock cycles (e.g. three clock cycles) after an acknowledge cycle begins and continue until a number of cycles (e.g. three clock cycles) after the acknowledge cycle ends. For example, no wait states may be permitted in either direction. A READ_XFER may indicate data flow from the secondary delay line cache 266 to the primary delay line cache 264. A WRITE_XFER may indicate data flow from the primary delay line cache 264 to the secondary delay line cache 266. The request may be complete as soon as a READ_XFER or a WRITE_XFER is complete.

In an example embodiment, the secondary delay line cache bus interface may not tolerate wait states during a data transfer and, accordingly, primary delay line cache RAM may need to provide more bandwidth than can be provided by a single-port RAM. In an example embodiment, a full dual-port RAM may be used. However, in another example embodiment, an interleaving scheme may be used. Accordingly, secondary delay line cache transfers to/from the primary delay line cache 264 may begin on an even address. The delay module 304 may then provide accesses to the primary delay line cache 264 in specific time-slots relative to the audio ring channel identifier. A delay module access start address may be either even or odd, however, so an additional level of data buffering allows for a single clock cycle delay in RAM access to avoid a collision. Accordingly, as described above by way of example, write transfers may have a three-clock delay instead of a two-clock delay as may ordinarily be required.

Example Secondary Cache Transport Bus Queuing

In an example embodiment, secondary cache RAM may be a full dual-port RAM to provide the bandwidth required for RSW operations from the transport bus 316. Additional bandwidth may be needed to accommodate a simultaneous primary delay line cache data transfer, which can occur if a primary delay line cache data transfer is in progress when transport bus read data arrives from a RSW request. Accordingly, in these circumstances, a transport bus first-queued protocol may be used to store and read data on the transport bus 316. The secondary delay line cache 266 may complete the in-progress primary delay line cache data transfer and wait for the first-queued data to return on the transport bus 316. While waiting, in an example embodiment, the secondary delay line cache 266 may not acknowledge any more primary delay line cache requests with data transfer status so that queued data will not remain on the transport bus 316 for more than a single round trip on the ring arrangement. In another example embodiment, the secondary cache RAM may be a quad-port RAM, which allows the primary delay line cache requests to complete concurrently with RSW operations from the transport bus 316. If the implementation of the read-sum-write addition logic requires a pipeline delay N from the reading of cache data to the writing of summed cache data, a small FIFO of depth N+1 is required on the input of data from the primary cache to the secondary cache to hold back the primary cache data summation temporarily if it is detected that the transport bus has already commenced summing into the same cache location that the primary cache is about to sum into. Similarly, a FIFO of depth N may be required on the transport side if it is detected that the primary cache has already commenced summing into the same cache location that the transport bus is about to sum into. One FIFO must be of a depth of one greater than the other FIFO to resolve the hazard of a simultaneous read of the same location from both the transport and the primary cache. To ensure that all such collision hazards are always resolved within the depth of the said fifos, the addressing order of the primary cache data burst can be reversed relative to the transport data burst. In other words, if the transport bus data burst order is from address K to address K+7, the primary cache data burst order is from address K+7 down to address K. This may ensure that at most only one address can overlap during concurrent bursts.

Example Secondary Cache Request Priority Queue

Figure 26:
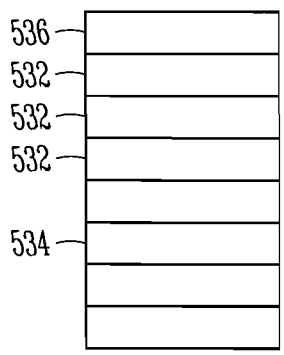
FIG. 26 shows an example secondary cache request priority queue.

Referring to the method 440 (see FIG. 18), in an example embodiment, an example secondary cache request priority queue 530 (see FIG. 26) stores the highest priority requests received from the primary delay line cache 264 that were unable to be inserted into the secondary delay line cache 266, for example, because the secondary delay line cache 266 was full.

In an example embodiment, the priority queue 530 may include eight levels 532 and the priority of a request received from the primary delay line cache 266 may be determined by examining a time budget parameter, for example, a time budget provided in the time budget field 512 as described above with reference to the secondary cache control register 510. For example, smaller time budgets may have a higher priority and, rather than immediately rejecting a primary delay line cache request when the secondary delay line cache 266 is full, the primary delay line cache request may be inserted into the priority queue 530. If a request received from the primary delay line cache 264 had an address matching a currently allocated secondary cache line address, but could not be processed at the time it was received because, for example, there was a pending transport read into the cache line, that request may be marked as a "recent hit" request, and may have higher priority than a "non-hit" request having the same time budget, unless the "non-hit" request is "urgent," e.g., having a time budget of 2 or less. In an example embodiment, the reason for giving "recent hit" requests higher priority is that they will not require a transport bus transaction, and thus can be dispatched quickly, if the request is still a cache hit when it is presented to the secondary cache the next time. The likelihood of a "recent hit" request still being a cache hit when presented a second time decreases as the request ages. If the secondary delay line cache request priority queue 530 is not full, the request from the primary delay line cache 264 may be inserted in order of priority in the priority queue 530. However, if the request priority queue 530 is full, the priority of the request from the primary delay line cache 264 may be compared with the priority of all requests in the priority queue 530. If the priority of the request received from the primary delay line cache 264 is lower than the priority of any requests in the priority queue 530, thereby indicating the current primary request has a higher priority, the request may be inserted into the priority queue 530. In these circumstances, the priority request with a lowest priority (e.g., at a level 534) may then be dropped from the priority queue and stored e.g. in a first-in-first-out (FIFO) buffer. The "recent hit" status of a request may not be saved in the FIFO buffer. When the FIFO buffer is full, a reject notice may be sent back to the primary delay line cache 264 so that the transaction or operation may be performed again at a later stage (e.g., a further request may be communicated from the primary delay line cache 264 to the secondary delay line cache 266). When a secondary cache line of the secondary delay line cache 266 becomes available, a request in the priority queue 530 having the highest priority (e.g., at level 536) may be inserted into the secondary delay line cache 266.

In example embodiments containing a reject FIFO, a fairness flag may permit alternating between the priority queue 530 and the reject FIFO for selection of requests to insert into the secondary delay line cache 266, during times when no requests from the primary cache are being received. The fairness flag may be toggled during each available insertion period when there is no primary cache request. Thus, when the fairness flag is in one state, requests may be inserted from the priority queue 530, and when it is in the other state, requests may be inserted from the reject FIFO. This may provide more opportunities for cache address tag matches, and may expose requests within the reject FIFO for which the time budget has decreased and thus may have become high priority requests. The time budget of a request in the FIFO can be maintained by inserting a time stamp with the request and its time budget when it is inserted into the FIFO, where the time stamp is read from a sample counter. When a request is read from the FIFO, its time budget may be updated by taking the difference of the current value of the sample counter from the time stamp saved in the FIFO, and then deducting this value from the time budget read from the FIFO with the request to compute the updated value of the time budget for the request.

The time budget may thus provide an indication of the length of a particular bus transaction latency required, and be in the form of a time budget parameter. The time budget parameter of a primary delay line cache request may also be used to prioritize the requests in the secondary cache request priority queue 530 and accordingly, in an example embodiment, ultimately in a transport module priority queue. In an example embodiment, the transport bus time budget parameter may be encoded as a floating-point value and the secondary delay line cache may translate the time budget value prior to placing it on the transport bus 316.

Although the subsystems 200, 300 are described, by way of example, with reference to the processing of digital audio signals, it will be appreciated that the subsystems 200, 300 may be used to process any digital signals including video and other multi-media signals. Unlike conventional digital processing devices, the subsystems 300 in accordance to an example embodiment allows each module 302 to 312 to communicate data with any other module 302 to 312 connected to the data path 314. In an example embodiment, the data path 314 is time-division multiplexed wherein a routing controller controls communication of data between the various modules 302 to 312. Further, it is to be appreciated, that the modules 302 to 312 are merely example modules and further modules (with the same or differing processing capabilities) may be included in the subsystem 300 and/or any one or more of the modules 302 to 312 may be removed and, for example, included within any other module 302 to 312.

Thus, in an example embodiment, any one of the modules 302, 306 to 312 may communicate data to the delay module 304. Accordingly, data being processed by the digital processing subsystem 300 may be flexibly routed to the delay module 304. It will be appreciated that a module 302 to 312 may also communicate data back to itself via the audio bus 318. Accordingly, repeated processing may be performed on the data by the same processing module.

The audio memory transport module 324 communicates via the data bus 321 with the interface module 322 that, for example, communicates with a bus 325 of the host computer device (for example a personal computer or PC). In an example embodiment, the interface module 322 includes a bridge 330 and two PCI-X bus interfaces 332 that interface the bridge 330 to the conventional PC bus 325 (which may correspond to the bus 112 of FIG. 1). The digital I/O module 312 may receive a digital audio input and provide digital audio output to an output device. As the various modules are located along the audio bus 318, audio data may be routed between modules without requiring the data to be routed through a central hub (e.g., a DSP).

In an example embodiment, each delay line of the delay line memory portion may be accessed with individual read and write operations that are separate from those of other delay lines. Accordingly, the memory circuit memory 208 may be directly coupled to a digital signal processor that executes the DSP algorithm. The direct coupling of these circuit elements allows the processor to access the local memory with relatively low latency, on-demand (e.g., as needed by the processor), and on a sample-by-sample basis. However, as the requirement for local or circuit memory increases in size, it may become less cost effective to use local memory to implement all the delay lines. Accordingly, delay lines can also be allocated to the main memory via the delay line cache.

Example Fractional Delay Line Modulation

In an example embodiment, one or more fractional delay lines are provided and a method and device are described to provide modulation of a write pointer in at least one delay line including multiple read pointers. Single write and multi-read delay lines, as described herein, may be used, for example, to generate sound effects such as those involving echoes of a moving source from multiple reflectors.

Modulation of the write pointer, as further described below, in an example embodiment, may involve moving of the write pointer toward or away from the read pointers, in order to change multiple delay line lengths in a single operation, instead of changing multiple read pointers associated with the delay lines. Because it is often desirable to change the length of delay lines, and because changing the length of a delay line by a single sample is an abrupt change, support for fractional delay lengths may be necessary.

Figure 27:
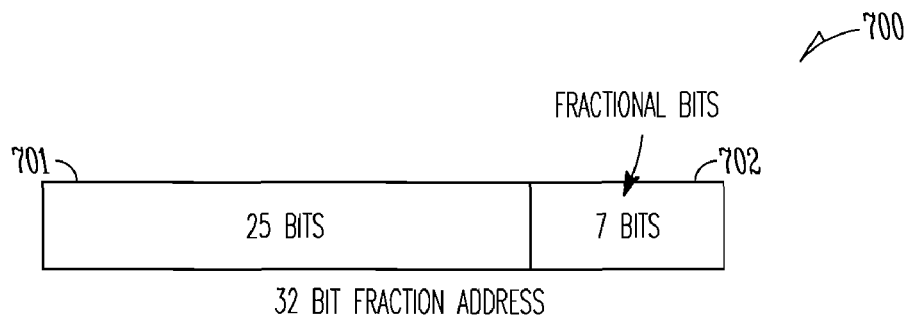
FIG. 27 shows example 32 bit address location identifying a selected fractional delay.

As the physical delay line memory cannot have a fractional memory location between two adjacent memory locations, data samples are stored in an address identified from an integer part of a selected delay. The fractional part of the delay may however be retained for subsequent processing as discussed below. FIG. 27 shows the bit structure of an example 32 bit address location 700 identifying a selected fractional delay. The integer part of the address may be stored in the 25 bit portion 701, and the fractional part may be stored in the 7 least significant bits portion 702. The address location 700 may identify a fractional value associated with a delay wherein only integer values of the fractional value are stored.

Figure 28:
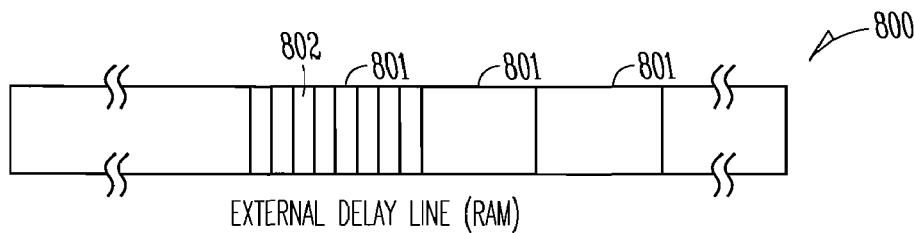
FIG. 28 shows an example external delay line.

Referring to FIG. 28, an example external delay line 800 is shown. The external delay line 800 may be provided in main memory such as the main memory 218 or an off-chip delay line memory 341 (see FIGS. 5 and 6). As mentioned before, since access to the example memory 218, 341 may involve undue latencies, in an example embodiment access to the memory 218, 341 may be obtained through a so-called vectorized or burst mode. This example mode may be characterized by the grouping of many read or write transactions to memory addresses into a single memory operation performed on a block of data. In the example delay line 800 of FIG. 28, the size of blocks 801 may be 8 double-words (DWORDS), where a double-word contains four bytes.

Figure 29:
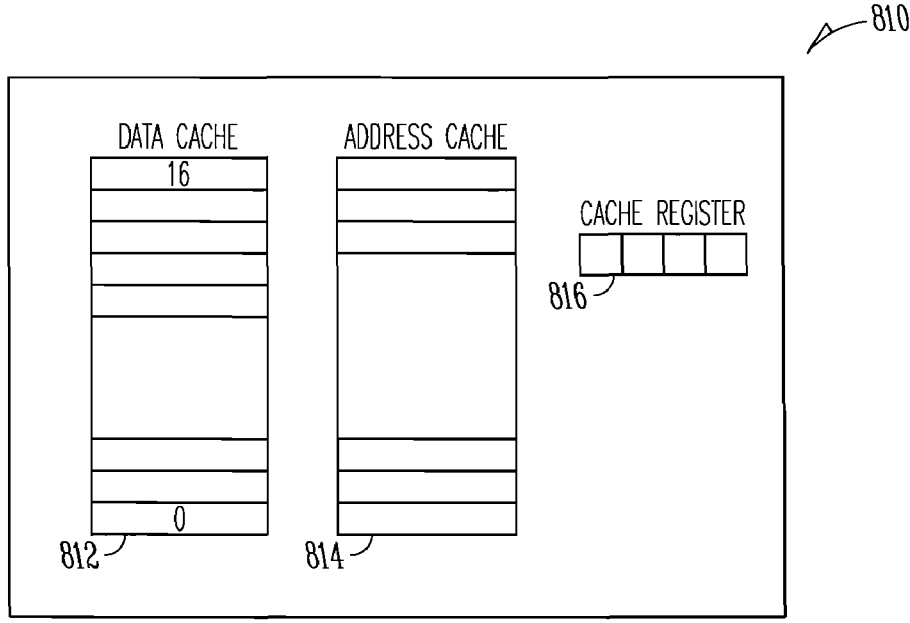
FIG. 29 shows an example secondary cache tank with its associated address cache and cache register.

FIG. 29 shows an example secondary tank cache 810 located between a primary cache such as the primary cache 264 (see FIG. 8), and a transport bus such as the transport bus 220 (see FIG. 5) to the external delay line 800. It should be noted, that the example fractional delay lines described herein are not limited to a system utilizing a ring configuration as shown in FIG. 6 but may be deployed in any delay line irrespective of the connection configuration between various modules. In an example embodiment, the secondary tank cache 810 may support both 32-bit and 16-bit access modes, as described in more detail below. In an example 32-bit access mode, each data cache 812 may include 16 data lines which each include 8 DWORDS. An address cache 814 may also be provided that includes addresses of corresponding delay lines in the data cache 812. In addition, a tank control cache register 816 may be provided. The cache register 816 (or state register) may be a cache register to retain secondary cache status bits.

Figure 30:
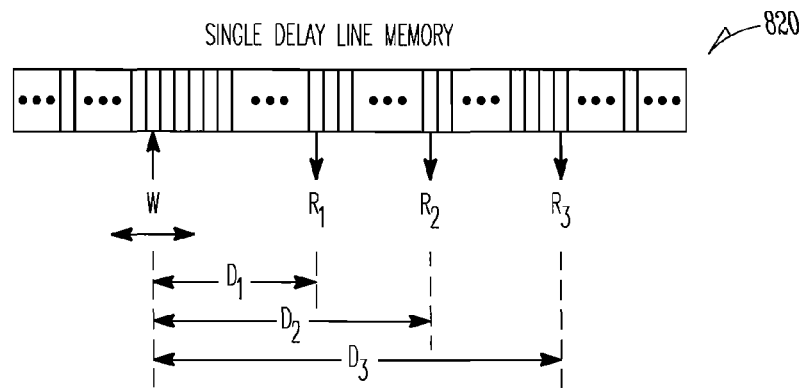
FIG. 30 shows an example delay line memory with multiple read pointers and a single write pointer.

In FIG. 30, an example delay line memory 820 with 3 read pointers R1-R3 and a single write pointer W, representing 3 individual delay lines is shown. It should be noted that any number of read pointers may be provided and that 3 read pointers are merely shown by way of example. The length of three example delays provided by a delay line in the delay line memory 820, in terms of sample periods, may be defined by example distances D1-D3. In an example embodiment, this multiple delay configuration may be used to generate echoes resulting from a fixed audio source reflecting off multiple reflecting surfaces. In case of a moving sound generator, the delays may increment or decrement, based on whether the source is moving away or towards the reflectors. In an example embodiment simulating such audio scenarios, which may be important in 3D positional audio, may be accomplished by moving either multiple read pointers, or moving a single write pointer. Moving the single write pointer to change multiple delay lengths may be more computationally efficient than moving multiple read pointers. Moving a single read pointer is somewhat easier process as it merely requires a reading existing data in the delay and no modification of existing data may be required. The case of moving the write pointer backwards or forwards may require re-writing data to the delay line. It should be noted that, for the purposes of this application, dynamically changing the position of the write pointer (e.g., dynamically changing a write pointer address) may be referred to as modulating the write pointer.

As mentioned before, in an example embodiment, changing the length of a delay line by a single sample may result in an abrupt change that may be unacceptable (e.g., it may produce unacceptable audio artifacts) and, accordingly, fractional delay lengths may be required to enhance digital processing (e.g., audio processing or video processing). In an example embodiment, fractional delays may be provided by linearly interpolating between adjacent delay line samples (and thus delay line address locations). In an example embodiment, linear interpolation may be performed by using a fractional portion of an address, both in read and write operations (see address location 700 in FIG. 27). When data samples are required for processing, a read operation may be performed on the primary cache and the samples obtained in the read operation may be interpolated. In the example audio ring configuration shown in FIG. 6 each read operation from delay line module 304 to the audio ring, or write operation into the delay line module 304 from data taken from audio ring may be referred to as a "tank access". When the tank access includes performing a write operation to the cache part of delay module 304, the input values from the audio ring may be interpolated.

Figure 31:
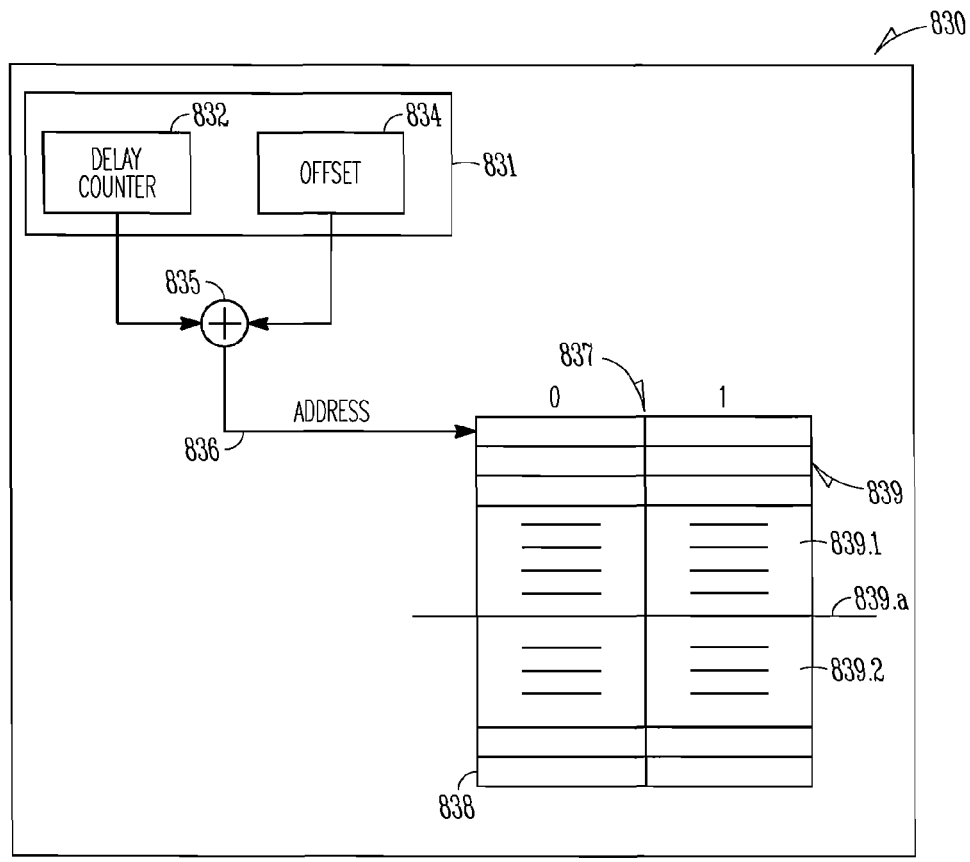
FIG. 31 shows an fractional delay line processing module according to an example embodiment.

Referring to FIG. 31, an example on-chip fractional delay line processing module 830, in accordance with an example embodiment, is shown. The delay line module 830 is shown to include a memory pointer 836 with an associated pointer modulation module 831. The pointer modulation module 831 is shown to include a delay counter 832 and a delay offset generator 834. Primary cache 837 (which may correspond to the primary cache 264 in FIG. 8) includes two duplicate caches 838 and 839 which may operate in a double-buffer or ping pong mode. In a ping-pong mode, data in one buffer is processed while the next set of data is read into the other buffer. In streaming media applications, the data in one buffer may be sent to a sound card and/or display adapter, while the other buffer is being filled with further data samples, for example, data samples from the secondary cache (e.g., the secondary delay line cache 266 shown in FIG. 8). The primary cache 837 of the delay line module 830 may be partitioned (as shown at 839.*a*) into a lower section 839.2 and an upper section 839.1. The lower section 839.2 may be used for relatively short delay lines, for example, delay lines which never require samples to be moved to the secondary cache 810 and may thus always stay within in the primary cache 837. The upper portion 839.1 and the lower partition 839.2 may also be referred to as external cache or internal cache, respectively. It will be understood that communicating data samples between the on-chip primary and secondary delay lines and external delay lines provided in main memory results in some latency. Accordingly, some restrictions on distances between pointers in the delay lines may be provided.

In the example configuration shown in FIG. 31, modulation of the write pointer may be accomplished by adding addresses generated by the delay counter 832 and the offset generator 834. The pointer modulation module may be software-controlled. The sum of these addresses (see summation node 835) may form the content of a write pointer address which points to a so-called "zero line" in the primary cache 837. If the internal cache is used, the entire address may point to a location in the internal cache memory. In an example embodiment wherein external cache is used, the lowest bits of the address may point to a data location in one of the accessory cache lines, and the upper part of the address may be sent on to the secondary cache. As mentioned above, while the first primary cache 838 is being accessed by primary tank logic, data from the alternate primary cache 839 may be sent to the main memory 800 (see also main delay line memory 341 in FIG. 5) via the secondary cache 810 (see also secondary delay line cache 266 in FIG. 8).

In an example embodiment, the delay counter 832 may be an internal on-chip counter used to generate an actual address within the primary cache 837. The delay counter 832 may be incremented once each sample period. For example, consider an example single delay line with a write access at location 4, a read access at location 0, and a delay counter value of 0. One sample period later the delay counter 832 will have incremented to 1 and the write and read accesses will address one location higher than during the previous sample period. After four sample periods the read access will deliver the value the write access stored four sample periods earlier. In an example embodiment, the addresses generated by the delay offset generator 834 may be fractional addresses that may be incrementing or decrementing, depending on the direction of movement of the memory pointer 836.

In an example embodiment, while stepping through addresses in the primary cache 837 one at a time and writing data into the primary cache 837, some address jumps may take place, e.g. a jump ahead, or skipping over an address due to the fractional component of the delay line address (see FIG. 27). When skipping over an address is encountered, control logic may duplicate a sample into the skipped sample addresses. Accordingly, a rule to write ahead and read behind may be implemented and, accordingly, the missing address may be filled with the content of the next address.

Table 840 in FIG. 32, shows an example scenario in which an integer address is skipped. In the table 840, example offset values (see column 844) are shown that start from a value of 1.5 (see row 843) and then increment each sample period. An output of the delay counter 832 (see column 842) is shown as starting at "0" and incrementing by a fractional value of 0.1, as the delay counter 832 generates successive higher address values. The fractional address values (see column 846) are the sum of the values in the first column 842 and the second column 844 and may be the actual modulated addresses of the write pointer. Thus, in an example embodiment, the fractional address values may represent intermediate data points for processing digital signals. A last column 848 may represent the integer part of the fractional address values provided in column 846. In an example embodiment, the integer part of the pointer address values (see column 848) is stored in a first 25 bits 701 of a 32 bit address location 700 as shown in FIG. 27 and the fractional part of the address may be stored in the last 7 bits 702. The 32 bit address location 700 may correspond to a memory block in the duplicate cache 838 and 839. It will be noted that, in the example integer addresses shown in FIG. 32, integer address 6 is missing. It will be appreciated that any one or more integers may be missing dependent upon the fractional data set. Accordingly, in the given example when the values in column 848 are written to the duplicate cache 838 and 839, the issue arises as to what value should be written to a memory location between adjacent locations in which a value of "5" and a value of "6" is to be written in the given example. In an example embodiment, the example value "5" may be duplicated, the value "7" may be duplicated, or an interpolated value may be written to the memory location 6.

Figure 33:
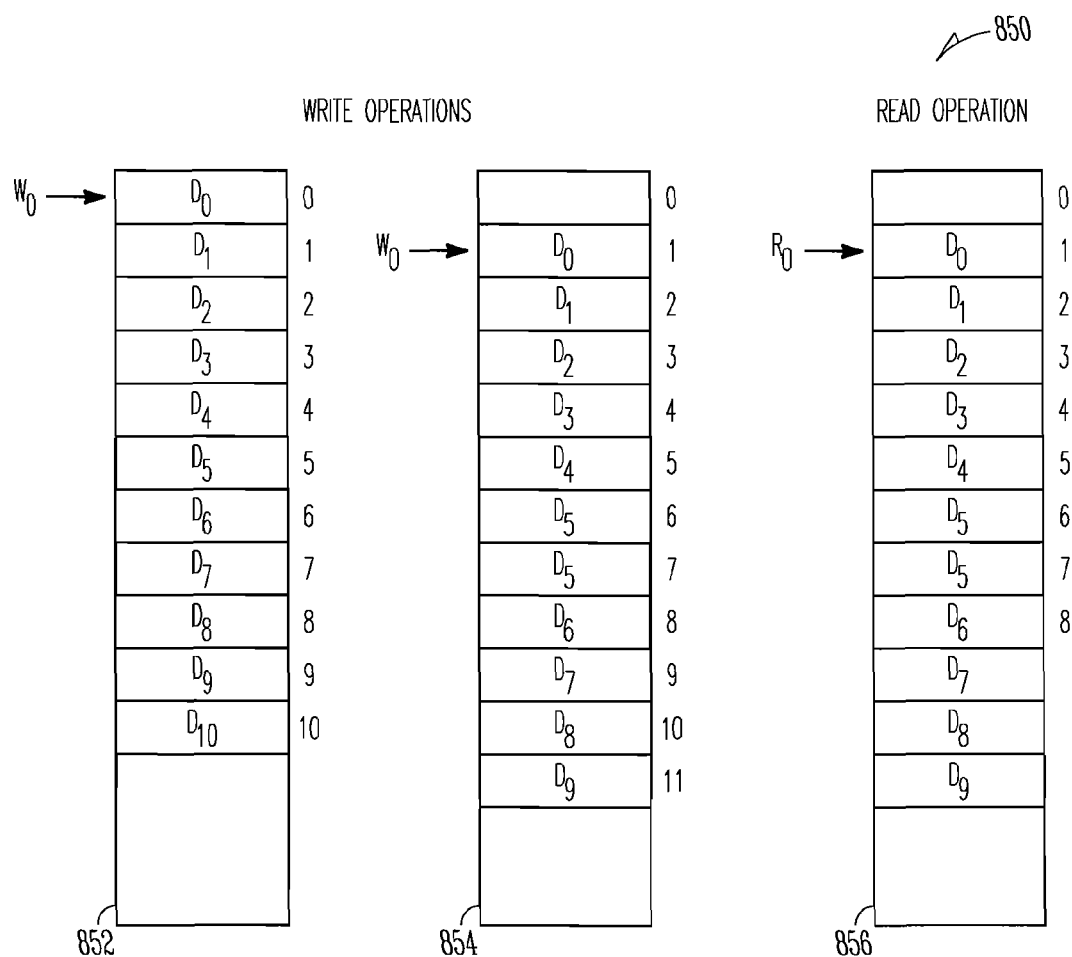
FIG. 33 shows the results of example modulated write and read operations, in accordance with an example embodiment, where the fractional part of the addresses are assumed to be zero.

FIG. 33 show example modulated write and read operations in memory locations 854 and 856. Memory locations 852 show example data which may be written when the offset (see offset generator 834) is assumed to be equal to zero sample periods. Accordingly, as the delay counter 852 increments, data samples are written progressively to sequential memory locations and no fractional functionality is performed. However, when a fractional value is to be written to the duplicate cache 838 and 839. However, when fractional delay values are to be written to a fractional address as shown for example in column 846 in FIG. 32, memory locations may be skipped when the integer part is extracted (e.g., too few values to fill consecutive memory locations). Instead, may also be too many values (e.g., duplicate integers) when the integer part is extracted. In the example shown in FIG. 32, there is no value for writing into the memory location between the location with an integer address value "5" and with an integer address value "7" (see arrow 841). Accordingly, the missing or skipped over address in this example case is "6". As seen from the summed values in the fourth column 848, the integer pointer address goes to 7 after 5 and thus jumps over address (or memory location) 6. In an example embodiment, the method and apparatus described herein addresses the issue of what value should be written into a following memory location when no integer value has been identified for that particular memory location.

It should be noted that, in an example embodiment, the delay line values are in effect being dynamically changed by moving the write pointer. The read pointers may thus remain unchanged by the variation of the offset; because, in order to change the length of a delay line, it is not necessary to move both the write and the read pointers, only moving one of them is enough and in this example case only the write pointer may be moved (see FIG. 30).

Figure 34:
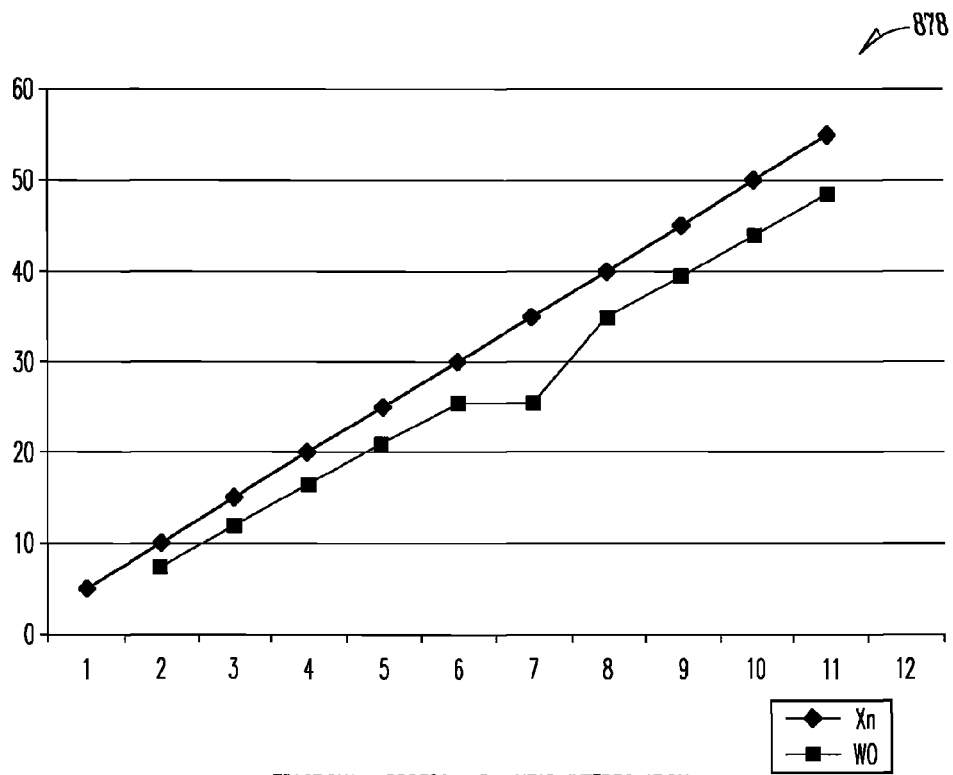
FIG. 34 shows results of example modulated write operations for a set of incrementing offset values, in accordance with an example embodiment, where the fractional part of the addresses is not zero.

In the case of fractional addresses, an example case of write operations (WO) for the example offset values of table 840 (see FIG. 32) is shown in table 860 (see FIG. 34). The values in second column 864 are optional example input sample data values (e.g., audio data samples). The example values in columns 866, 868, and 870 are directly taken from columns 844, 846 and 848 of table 840 in FIG. 32. Write operation values in column 872 are examples of interpolated data written as a result of write data interpolation using an interpolation (e.g., using the Formula 2 below). The input values for these interpolated results used in Formula 2 below, are the example values of Xn (column 864). It should be noted that computation of first a write operation value according to Formula 2, would need sample data value after X0 and the fractional address (see column 868) at X0. The values in column 874 are adjusted output addresses for each write operation. As compared to the values in column 870 (or column 848 of table 840 in FIG. 32), the missing address value 6 (due to extracting only the integer portion) is now provided so the write operation can write data to sequential memory locations. Adjusted output data values in column 876 are the result of an example adjustment in the data values of column 872. In an example embodiment the applied adjustment, as shown in line 860.6 of column 876, fills the skipped address 6 with the value of 25.5, which is the value of the data content of address 5 (the previous address). A graph 878 provides an example comparison of the adjusted interpolated written data WO (values of column 876) with its input sample data values Xn (values of column 864).

Table 880 in FIG. 35, shows an example scenario where the offset is decremented from an initial example value of 2.5. Unlike the example provided in FIG. 32 where an integer value, and thus an address location, is skipped due to using only the integer portion of the fractional address, it will be noted that in the example table 880 a duplicate value is shown to exist. In the given example the duplicate address value "7" as shown in column 882, rows 886 and 888.

Figure 36:
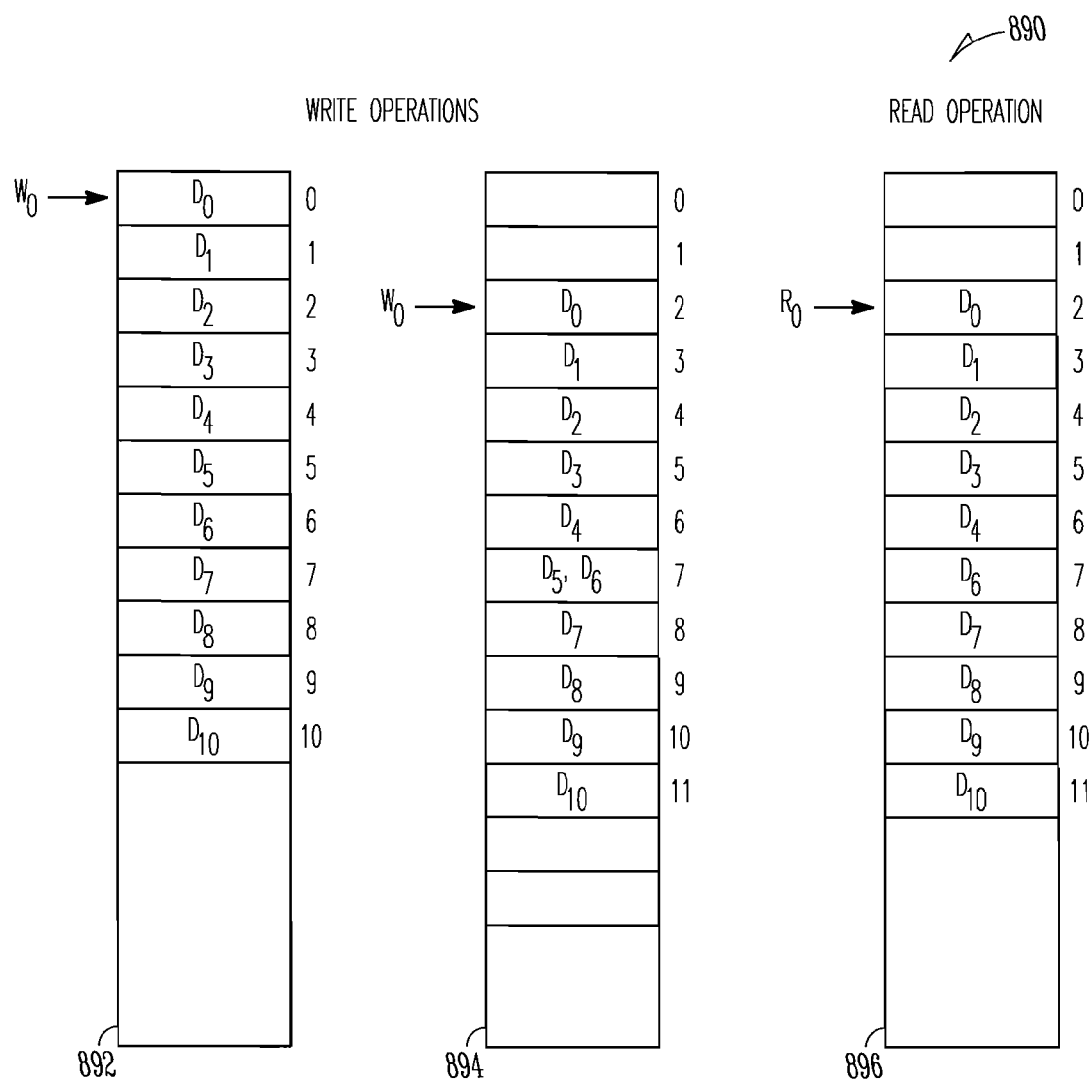
FIG. 36 shows the results of example modulated write and read operations, in accordance with an example embodiment, where the fractional part of the addresses are assumed to be zero.

FIG. 36 shows the results of example modulated write and read operations 890, in accordance with an example embodiment, where the fractional part of the addresses are assumed to be zero. FIG. 36 shows how read and write operations can be affected by an offset in write pointer addresses where offset values are decremented. For the example, in the read and write operations 890 shown in FIG. 36, only integer values of offsets in column 884 of table 880 are utilized. Memory locations 892 show an example where data is written without any offset. Memory locations 894 show an example where offset values are taken into account. As shown in memory locations 894, in the given example two consecutive data values of D5 and D6 arise that effectively require writing to a single line address 67, as indicated by address numbers on the right hand side of 894 in FIG. 36. This may happen if the offset value was decremented by one in the sample period immediately after D5 was written to memory, causing the write pointer to point to the same address in the next sample period when it is time for D6 to be written to memory. In order to solve this conflict, in an example embodiment both values may be written but, when performing a read operation only the value of D6 may be read (see in address 7, as indicated by address numbers on the right hand side of 896 in FIG. 36. As seen by this example, ignoring the fractional part of the write pointer may result in loss of one sample data point.

Figure 37:
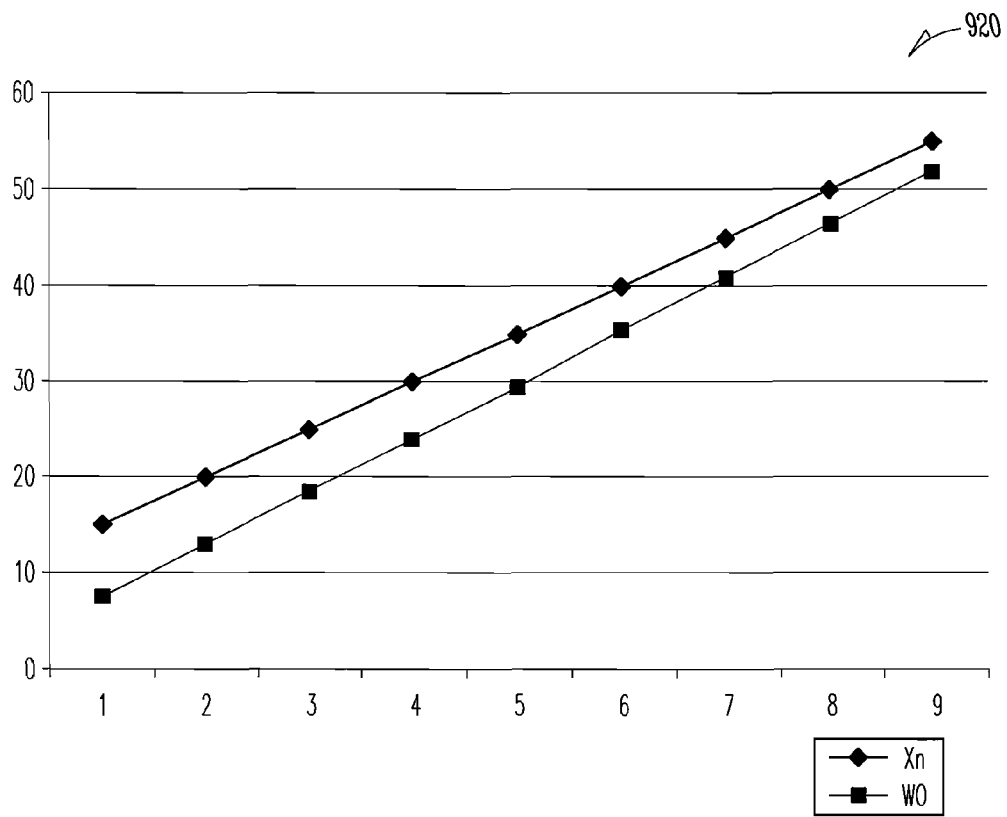
FIG. 37 shows results of example modulated write operations for a set of decrementing offset values, in accordance with an example embodiment, where the fractional part of the addresses is not zero.

Table 900 in FIG. 37 shows the results of an example write pointer modulation method with fractional offsets. The table 900 also includes example adjustments that may be used to correct the problem of two data values that may arise due to selection of the integer portion when decrementing offset values. Values shown in columns 904, 906 and 908 are taken directly from the table 880 shown in FIG. 35. Values in column 910 are the integer output address values of the example fractional address values shown in column 908. Write operation (WO) values in column 912 are examples of data that has been interpolated using an interpolation formula (e.g., the Formula 2 listed below). The input values for interpolation are the example Xn values shown in column 904. It should be noted that computation of a first WO may need a sample data value after X0 and the fractional address at X0. Example output adjusted address values are shown in column 914. It will be noted that, in column 914 the extra or duplicate output address value 67 shown in column 910 has been eliminated. The example values shown in column 916 are the result of an adjustment to the values of column 912 and, in particular, the elimination of the value 35 corresponding to the duplicate output address 6 7 (see row 900.6 of column 910). A graph 920 shows a comparison between the adjusted interpolated written data WO (see column 916) with its input sample data values Xn (see column 904).

Fractional Length Delay Lines and Linear Interpolation

Figure 38:
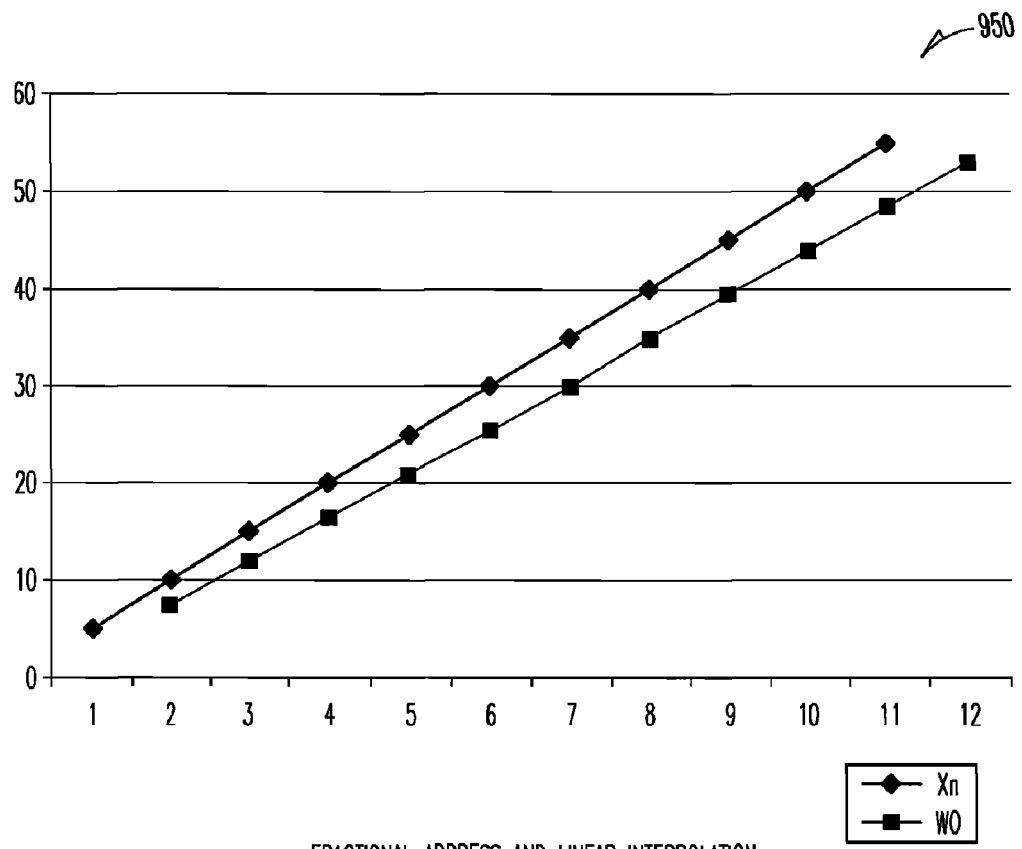
FIG. 38 shows the results of example modulated write operations for a set of incrementing offset values, where the fractional part of the addresses is not zero with a different example embodiment adjustment.

Table 930 in FIG. 38 shows the results of an example write pointer modulation method with fractional offsets. Table 930 substantially resembles the table 860 shown in FIG. 34. However, it will be noted that in column 946, row 930.7 includes a different value (value of 30) to that provided in column 876, row 860.7 (value of 25.5). Thus, in this example, the methodology uses an additional interpolation to generate an adjusted output data value 30 (an interpolated value halfway between 25.5 and 35) instead of repeating the data value 25.5. This may provide a more accurate realization of the delayed input waveform. It will be appreciated that more sophisticated interpolation methods than the above could be employed to produce an even more accurate approximation of the missing sample. A graph 950 shows a comparison between the adjusted interpolated written data WO (see column 946) with its input sample data values Xn (see column 934).

Figure 39:
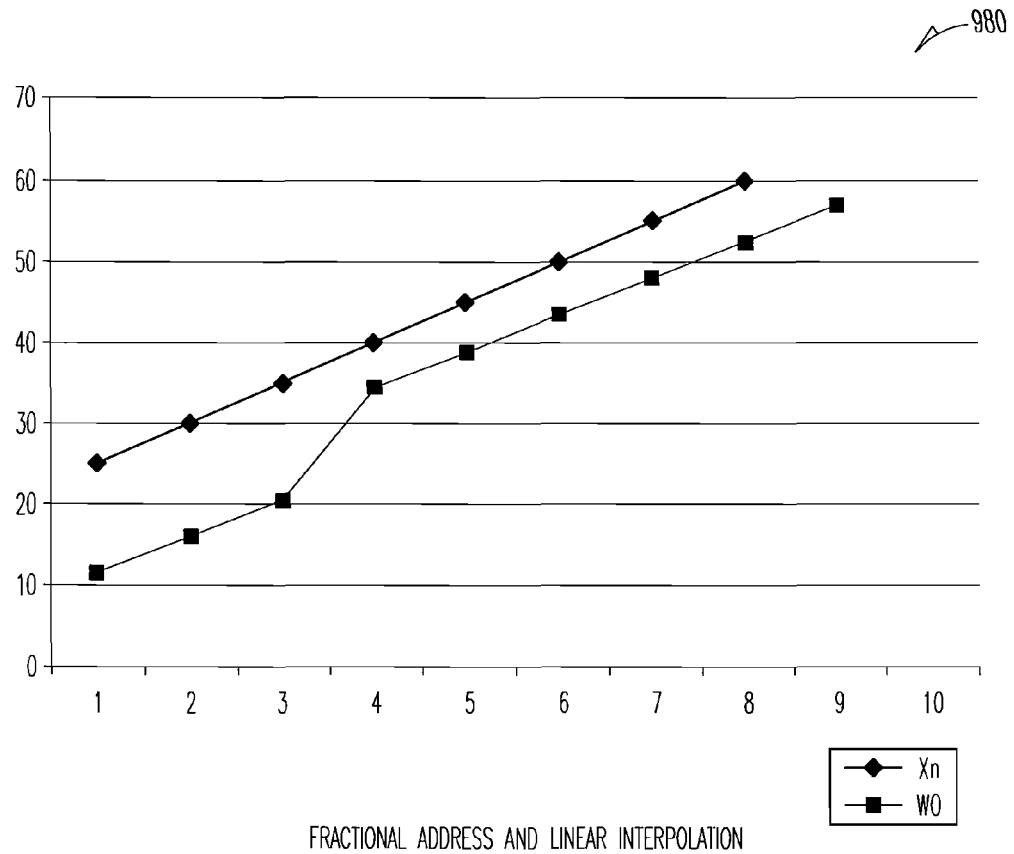
FIG. 39 shows results of example read out operations for a set of decrementing offset values, where the fractional part of the addresses is not zero with a different example adjustment.

Table 960 in FIG. 39 shows an example data read out (RO) from the primary cache. The output data RO in column 972 are generated from Xn data of column 964. For this case the Formula 1 below may be used to calculate each read out data from the sample data Xn using the fractional part of the addresses in column 968. The data in column 974 are adjusted read out data for the repeated address 6 (see column 970), where the value of 25 from column 972 is eliminated. A graph 980 shows a comparison between the adjusted interpolated written data WO (see column 974) with its input sample data values Xn (see column 964).

The example embodiments described herein may be configured to support 48 KHz fractional delays by linearly interpolating between adjacent delay line samples. The linear interpolation may be performed using the fractional portion of the address, as herein described. If the address is an integer, the effect may be to disable interpolation, although that may be simply a consequence of the linear interpolation equation:

$$o_n = x_n + f \cdot (x_{n+1} - x_n)$$ (Formula 1)

As one can clearly see, if the fraction, f, is zero, the output $o_n$ is simply equal to the input, $x_n$.

When the tank access is performing a read operation from the audio ring the values in the primary cache may be interpolated. When the tank access is performing a write operation to delay memory 304 the input values from the audio ring may be interpolated. The interpolation fraction used when writing may be equal to 1.0−fraction rather than fraction in order to delay the input to the delay memory 304. This is algebraically equivalent to swapping input data $x_n$ and $x_{n+1}$ in the equation as follows:

$$o_{n+1} = x_{n+1} + f \cdot (x_n - x_{n+1})$$ (Formula 2)

When there is no interpolation, the written output to the delay memory may represent the next output $O_{n+1}$ rather than the current output $O_n$. The output may then become $x_{n+1}$, which may then be written to $o_{n+1}$ in order to make the delay time correct. In addition, the input may be triple-buffered in order to guarantee two stable values for the linear interpolation of write operations.

Tank 16-Bit and 32-Bit Data

Tank access may use 16-bit or 32-bit data formats. The 32-bit format may be the same IEEE-754 single precision floating point format used by the example audio ring shown in FIG. 6. The 16-bit format may have a 3 bit exponent and a 13 bit twos complement mantissa with a range of −1.0 to +1.0. Calculations may saturate if the range of the data format is exceeded.

Delays implemented with 32-bit data may use twice as much delay line memory for a given delay length. Also delay lines implemented with 32-bit data use twice as much PCI bandwidth and may have less allowable bus latency for each request. Note that 32-bit and 16-bit data can be used at the same time because they exist in different logical partitions of the tank delay memory.

In an example embodiment, the delay memory 812 can be arbitrarily partitioned. Both the 32-bit and 16-bit partitions may have a base address and a buffer size register. The default (reset) condition may be both base addresses and buffer sizes set to zero. Software may initialize these prior to starting tank accesses. The primary tank cache may not initiate secondary cache requests if the buffer size is zero. A 16-bit opcode may effectively be a nop if the 16-bit buffer size is set to zero. Accordingly, a 32-bit opcode will effectively be a nop if the 32-bit buffer size is set to zero.

Thus, a method and device to allow fractional modulation of digital delays lines have been described. Although, the present invention has been described with reference to specific example embodiments, it will be evident that various modifications and changes may be made to these embodiments without departing from the broader spirit and scope of the example embodiments. Accordingly, the specification and drawings are to be regarded in an illustrative rather than a restrictive sense.

What is claimed is:

1. A signal processing device to fractionally modulate a write pointer to provide one or more fractional delay lines, the signal processing device comprising:
    circuitry configured to generate a fractional address for each of a plurality of sample periods by adding a delay value and a fractional offset value; and
    processing circuitry configured to generate interpolated input sample values based on a fractional portion of the fractional address and to perform a write operation to an address associated with an integer portion of the fractional address for each sample period using the interpolated input sample values.

2. The signal processing device of claim 1, wherein the processing circuitry is configured to generate the interpolated input sample values by performing a linear interpolation on the input sample values using the fractional portion of the fractional address, and
    wherein the processing circuitry is configured to refrain from generating an interpolated input sample value for a fractional address that has a fractional portion equal to zero.

3. The signal processing device of claim 2, further comprising control logic,
    wherein when the fractional offset value is increased for each sample period, and when the integer portion of the fractional address for two or more consecutive sample periods skips one or more integer values due to the increasing fractional offset value, the control logic is configured to:
    provide one of a duplicated or an interpolated sample for writing into an address associated with the skipped one or more integer values; and
    generate adjusted output addresses to allow the write operation to write data to sequential memory locations,
    wherein the write operation writes the interpolated input sample values to the adjusted output addresses.

4. The signal processing device of claim 3, wherein the fractional offset value is decreased for each sample period and when the integer portion of the fractional address for two or more consecutive sample periods comprises a duplicate of one or more integer values due to the decreasing fractional offset value, the control logic generates adjusted output addresses to eliminate addresses associated with the duplicated one or more integer values, and
    wherein the write operation writes the interpolated input sample values to the adjusted output addresses.

5. The signal processing device of claim 3, wherein the circuitry configured to generate a fractional address comprises:
    a delay counter configured to generate the delay value and to increment the delay value for each sample period;
    an offset generator configured to generate the fractional offset value and to either increase or decrease the fractional offset value each sample period; and
    a summation node configured to add the delay value and the fractional offset value to generate the fractional address for each sample period.

6. The signal processing device of claim 1, further comprising a delay line memory to provide two or more of the fractional delay lines,
    wherein a write pointer of the delay line memory is fractionally modulated by a dynamic changing of addresses associated with integer portions of the fractional addresses by the processing circuitry, and
    wherein each of the one or more fractional delay lines have differing delay lengths defined by different read pointers and the fractionally modulated write pointer.

7. The signal processing device of claim 6, wherein two or more fractional delay lines are configured to generate echoes from an audio source to simulate reflections off one or more surfaces.

8. The signal processing device of claim 1, wherein the fractional address is an actual address of a write pointer.

9. The signal processing device of claim 8, wherein the integer portion of the fractional address is stored in a first portion of an address location and the fractional portion is stored in last portion of the address location.

10. The signal processing device of claim 8, wherein the integer portion of the fractional address is stored in a first 25-bits of a 32-bit address location and the fractional portion is stored in a last 7-bits of the 32-bit address location.

11. A method of modulating a write pointer to provide one or more fractional delay lines, the method comprising:
    generating a fractional address for each of a plurality of sample periods by adding a delay value and a fractional offset value; and
    generating interpolated input sample values based on a fractional portion of the fractional address and performing a write operation to an address associated with an integer portion of the fractional address for each sample period using the interpolated input sample values.

12. The method of claim 11, wherein generating the interpolated input sample values comprises performing a linear interpolation on the input sample values using the fractional portion of the fractional address, and
    wherein the method further comprises refraining from generating an interpolated input sample value for a fractional address that has a fractional portion equal to zero.

13. The method of claim 12, further comprising increasing the fractional offset value for each sample period,
    wherein when the integer portion of the fractional address for two or more consecutive sample periods skips one or more integer values due to the increasing fractional offset value, the method comprises:
    providing one of a duplicated or interpolated sample for writing into an address associated with the skipped one or more integer values;
    generating adjusted output addresses to allow the write operation to write data to sequential memory locations; and
    writing the interpolated input sample values to the adjusted output addresses.

14. The method of claim 13, comprising decreasing the fractional offset value for each sample period,
    wherein when the integer portion of the fractional address for two or more consecutive sample periods comprises a duplicate of one or more integer values due to the decreasing fractional offset value, the method further comprises:
    generating adjusted output addresses to eliminate addresses associated with the duplicated one or more integer values; and
    writing the interpolated input sample values to the adjusted output addresses.

15. The method of claim 13, wherein generating the fractional address comprises:
    generating the delay value and incrementing the delay value for each sample period;
    generating the fractional offset value to increase or decrease the fractional offset value each sample period; and
    adding the delay value and the fractional offset value to generate the fractional address for each sample period.

16. The method of claim 11, further comprising:
providing delay line memory to provide two or more of the fractional delay lines; and
dynamically changing addresses associated with integer portions of the fractional addresses to fractionally modulate a write pointer of the delay line memory, and
wherein each of the one or more fractional delay lines have differing delay lengths defined by different read pointers and the fractionally modulated write pointer.

17. The method of claim 16, further comprising generating echoes from an audio source using two or more fractional delay lines to simulate reflections off one or more surfaces.

18. The method of claim 11, wherein the fractional address is an actual address of a write pointer.

19. The method of claim 18, further comprising:
storing the integer portion of the fractional address in a first portion of an address location; and
storing the fractional portion in last portion of the address location.

20. The method of claim 18, further comprising:
storing the integer portion of the fractional address in a first 25-bits of a 32-bit address location; and
storing the fractional portion is stored in a last 7-bits of the 32-bit address location.

21. A fractionally modulated digital delay line comprising:
a delay line memory to provide two or more fractional delay lines,
wherein a write pointer of the delay line memory is fractionally modulated by a dynamic changing of addresses associated with integer portions of fractional addresses, and
wherein each of the one or more fractional delay lines have differing delay lengths defined by different read pointers and the fractionally modulated write pointer.

22. The fractionally modulated digital delay line of claim 21, further comprising:
circuitry configured to generate the fractional address for each of a plurality of sample periods by adding a delay value and a fractional offset value; and
processing circuitry configured to generate interpolated input sample values based on a fractional portion of the fractional address and to perform a write operation to an address associated with an integer portion of the fractional address for each sample period using the interpolated input sample values.

23. The fractionally modulated digital delay line of claim 22, wherein the circuitry to generate a fractional address comprises:
a delay counter configured to generate the delay value and to increment the delay value for each sample period;
an offset generator configured to generate the fractional offset value and to increase or decrease the fractional offset value each sample period; and
a summation node configured to add the delay value and the fractional offset value to generate the fractional address for each sample period.

24. The fractionally modulated digital delay line of claim 22, wherein the processing circuitry is configured to generate the interpolated input sample values by performing a linear interpolation on the input sample values using the fractional portion of the fractional address, and
wherein the processing circuitry is configured to refrain from generating an interpolated input sample value for a fractional address that has a fractional portion equal to zero.

25. The fractionally modulated digital delay line of claim 24, further comprising control logic,
wherein when the fractional offset value is increased for each sample period,
wherein when the integer portion of the fractional address for two or more consecutive sample periods skips one or more integer values due to the increasing fractional offset value, the control logic is configured to:
provide one of a duplicated or interpolated sample for writing into an address associated with the skipped one or more integer values; and
generate adjusted output addresses to allow the write operation to write data to sequential memory locations, and
wherein the write operation writes the interpolated input sample values to the adjusted output addresses.

26. The fractionally modulated digital delay line of claim 25, wherein the fractional offset value is decreased for each sample period,
wherein when the integer portion of the fractional address for two or more consecutive sample periods comprises a duplicate of one or more integer values due to the decreasing fractional offset value, the control logic generates adjusted output addresses to eliminate addresses associated with the duplicated one or more integer values, and
wherein the write operation writes the interpolated input sample values to the adjusted output addresses.

27. The fractionally modulated digital delay line of claim 22, wherein the fractional address is an actual address of a write pointer.

28. The fractionally modulated digital delay line of claim 27, wherein the integer portion of the fractional address is stored in a first portion of an address location and the fractional portion is stored in last portion of the address location.

29. A computer-readable medium that stores instructions for execution by one or more processors to perform operations to modulate a write pointer to provide one or more fractional delay lines, the operations comprising:
generating a fractional address for each of a plurality of sample periods by adding a delay value and a fractional offset value; and
generating interpolated input sample values based on a fractional portion of the fractional address and to perform a write operation to an address associated with an integer portion of the fractional address for each sample period using the interpolated input sample values.

30. A system to modulate a write pointer to provide one or more fractional delay lines, the system comprising:
means for generating a fractional address for each of a plurality of sample periods by adding a delay value and a fractional offset value; and
means for generating interpolated input sample values based on a fractional portion of the fractional address and performing a write operation to an address associated with an integer portion of the fractional address for each sample period using the interpolated input sample values.

* * * * *

UNITED STATES PATENT AND TRADEMARK OFFICE
CERTIFICATE OF CORRECTION

PATENT NO.        : 8,060,226 B2                                          Page 1 of 1
APPLICATION NO.   : 11/831656
DATED             : November 8, 2011
INVENTOR(S)       : Thomas C. Savell et al.

It is certified that error appears in the above-identified patent and that said Letters Patent is hereby corrected as shown below:

IN THE SPECIFICATIONS:

In column 14, line 3, delete "341" and insert -- 341. --, therefor.

In column 31, line 15, delete "67," and insert -- 7, --, therefor.

IN THE CLAIMS:

In column 33, line 57, in Claim 5, delete "value each" and insert -- value for each --, therefor.

In column 34, line 64, in Claim 15, delete "value each" and insert -- value for each --, therefor.

In column 35, line 52, in Claim 23, delete "value each" and insert -- value for each --, therefor.

Signed and Sealed this
Sixth Day of March, 2012

David J. Kappos
*Director of the United States Patent and Trademark Office*